(12) United States Patent
Kawakami

(10) Patent No.: US 6,380,735 B1
(45) Date of Patent: Apr. 30, 2002

(54) ORTHOGONAL FLUX-GATE TYPE MAGNETIC SENSOR

(75) Inventor: Makoto Kawakami, Takatsuki (JP)

(73) Assignee: Sumitomo Special Metals Co., Ltd., Osaka (JP)

(*) Notice: Subject to any disclaimer, the term of this patent is extended or adjusted under 35 U.S.C. 154(b) by 0 days.

(21) Appl. No.: 09/558,369

(22) Filed: Apr. 26, 2000

(30) Foreign Application Priority Data

Apr. 30, 1999 (JP) .......................................... 11-125302
Mar. 16, 2000 (JP) ...................................... 2000-074890

(51) Int. Cl.$^7$ .............................................. G01R 33/04
(52) U.S. Cl. ..................... 324/253; 33/361; 240/870.33
(58) Field of Search ................................. 324/253, 254, 324/255, 249; 33/361; 340/870.33; 360/111

(56) References Cited

U.S. PATENT DOCUMENTS

| | | | | |
|---|---|---|---|---|
| 2,856,581 A | * | 10/1958 | Alldredge | 324/253 |
| 3,135,199 A | * | 6/1964 | Brown | 102/417 |
| 3,453,531 A | * | 7/1969 | Warren | 324/346 |
| 3,718,872 A | * | 2/1973 | Takeuchi | 324/173 |
| 4,536,710 A | * | 8/1985 | Dunham | 324/244 |
| 4,724,390 A | * | 2/1988 | Rauscher et al. | 324/344 |
| 5,023,799 A | * | 6/1991 | Nakayama et al. | 364/449 |
| 5,572,129 A | * | 11/1996 | Carlson | 324/318 |

FOREIGN PATENT DOCUMENTS

| | | |
|---|---|---|
| JP | 7-181239 | 7/1995 |
| JP | 7-248365 | 9/1995 |
| JP | 10-90381 | 4/1998 |

* cited by examiner

Primary Examiner—Jay Patidar
Assistant Examiner—Reena Aurora
(74) Attorney, Agent, or Firm—Burns, Doane, Swecker & Mathis, LLP

(57) ABSTRACT

A magnetic sensor of orthogonal flux-gate type is provided with a cylindrical core made of a soft magnetic material; an internal conductor that is placed inside the core; a detection coil wound up on the core; and an external conductor that is placed around the core and electrically connected to the internal conductor. A high-frequency current is allowed to flow through the internal core so that a magnetic field to be measured which resides around the detection coil is changed and the intensity and direction of the magnetic field to be measured is detected on the basis of an output of the detection coil. Since the external conductor is placed on the periphery of the core, it is possible to prevent the magnetic flux formed by the core from magnetizing any space, and consequently to concentrate the magnetic field on the core.

9 Claims, 19 Drawing Sheets

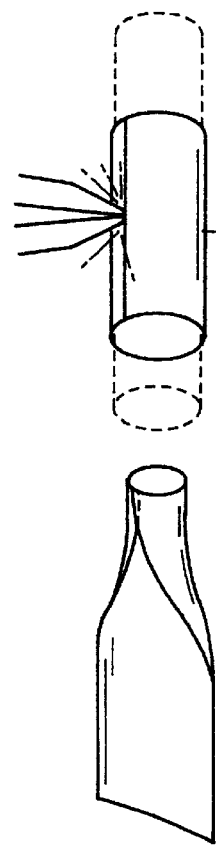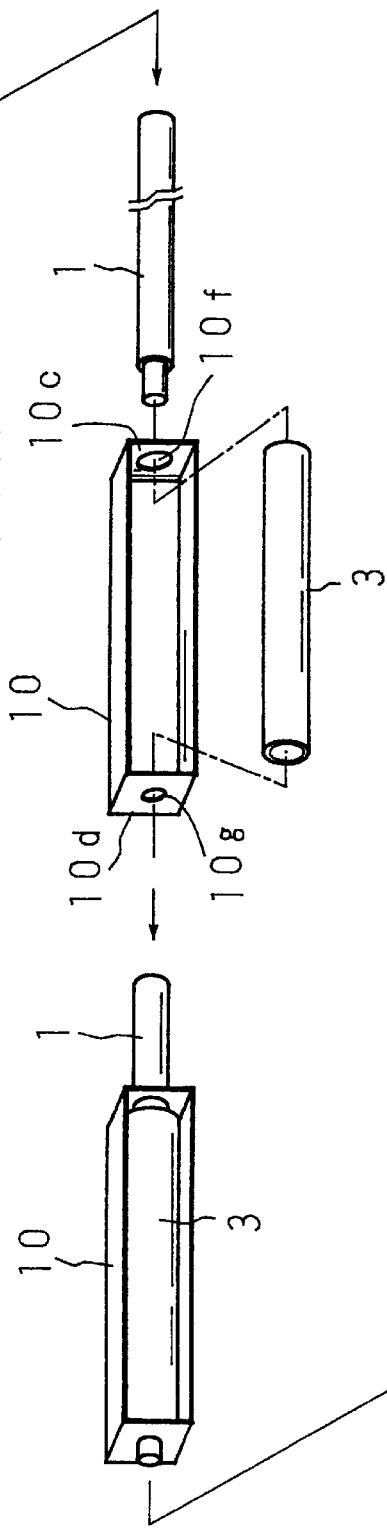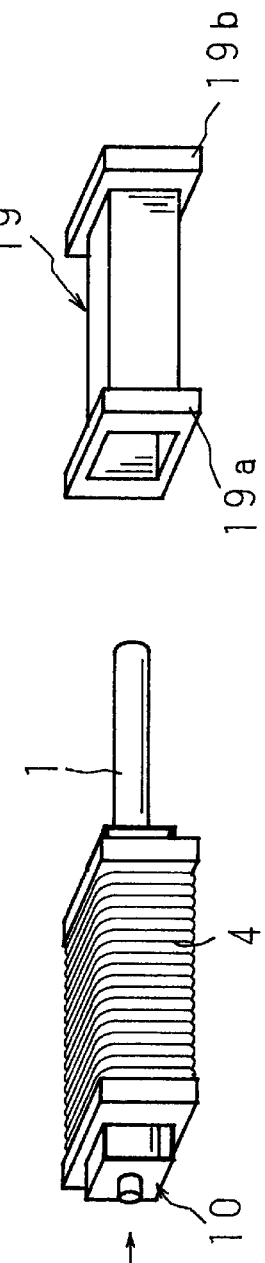

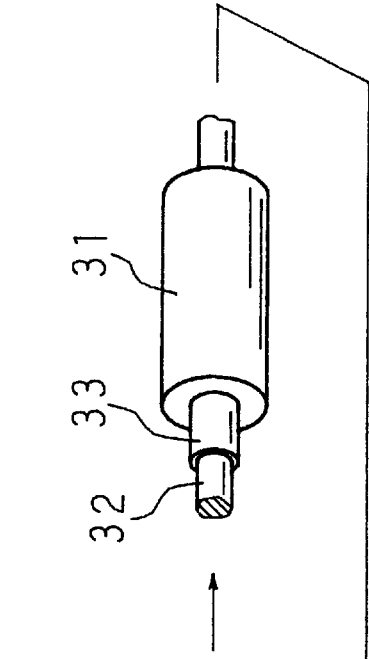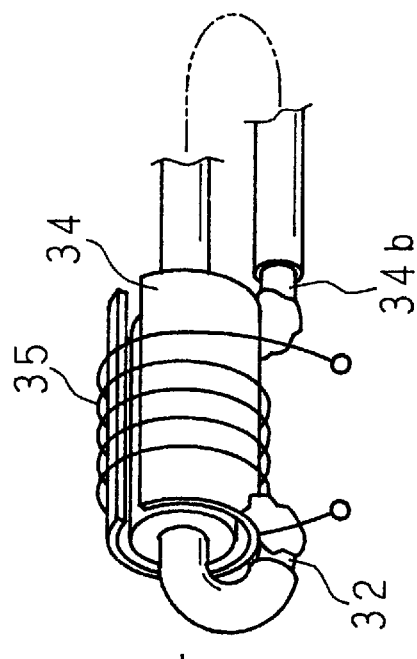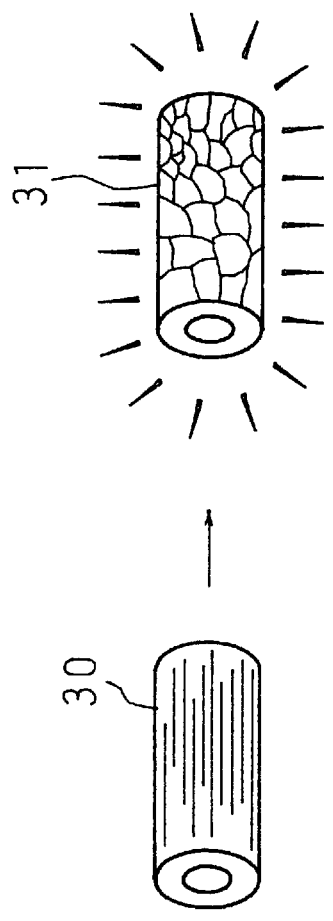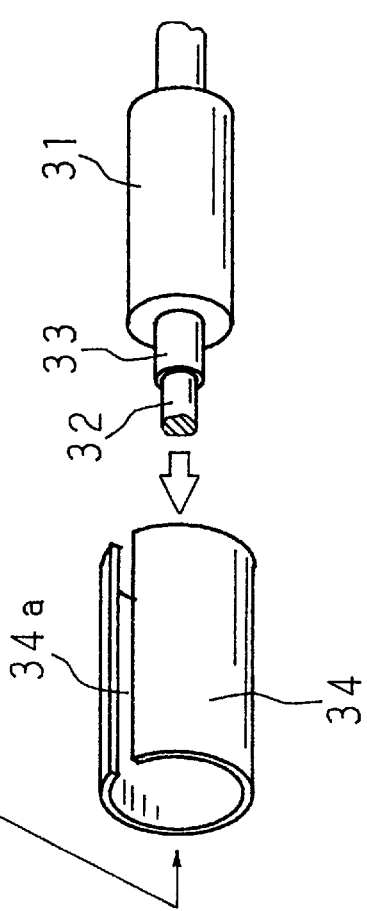

ORTHOGONAL FLUX-GATE TYPE MAGNETIC SENSOR

BACKGROUND OF THE INVENTION

The present invention relates to a magnetic sensor of orthogonal flux-gate type which can detect the intensity and direction of a magnetic field and a manufacturing method for such a sensor.

Recently, there have been ever-increasing demands for small-size inexpensive magnetic sensors with high precision which can detect the intensity of a magnetic field as well as the direction of the magnetic field, and these sensors are used for detection sensors for magnetic markers on a road related to an automobile assist cruise and advanced high way system, magnetic sensors used for electronic compasses and navigation systems on vehicle equipment, measuring magnetic sensors for a magnetic field of live body such as the heart, and detection magnetic sensors for use in non-destructive inspection for steel, etc.

With respect to conventional magnetic sensors of this type, examples thereof include: Hall elements, MR elements, MI elements, superconducting quantum interference devices (SQUID), magnetic sensors of parallel or orthogonal flux-gate type, etc. Among these, the Hall elements are poor in sensitivity, and MR elements, MI elements, etc. are inferior in that since a single element cannot detect the direction of a magnetic field, a plurality of them need to be installed. In contrast, magnetic sensors of both parallel and orthogonal flux-gate types are able to detect the intensity and direction of a magnetic field even when installed as a single sensor. Moreover, these sensors are superior in the linear property, temperature characteristic and resolution of the detection output, and in particular, from the viewpoint of detection precision, attention has been focused on those of orthogonal flux-gate type because of their high precision.

FIG. 1A is an explanatory drawing that shows the principle of an element of orthogonal flux-gate type; FIG. 1B is an explanatory drawing that shows a magnetic flux formed in the core; FIG. 2 is an explanatory drawing that shows the operation thereof; and FIG. 3 are waveform diagrams showing an exciting current, a degree of magnetization in the core length direction and an output voltage of the detection coil, in the case when detection for a magnetic field is made by using the element shown in FIG. 1A.

Reference numeral 21 is a bar-like conductor made by a conductive material, 22 is a cylindrical core made by a soft magnetic material, 23 is a detection coil, and 25 is a high-frequency power source. The bar-like conductor 21 is placed coaxially with the core 22 through the inside of the core 22, and the bar-like conductor 21 is connected to the high-frequency power source 25. When the magnetic sensor of this type is placed with the axial line of the bar-like conductor 21 and the core 22 aligned in parallel with the direction of a magnetic field to be measured, the magnetic flux inside the magnetic field to be measured is attracted toward the core 22 side as illustrated in FIG. 2(a), so that a magnetic path is formed through the core 22.

When an exciting current $I_{Ex}$ having a sine-wave as shown in FIG. 3 is flowed through the rod-like conductor 21, the peripheral face of the core 22 is magnetized as indicated by arrow in FIG. 2(b) so that the exciting current $I_{EX}$ is allowed to increase from a state shown in FIG. 3(a), and when it reaches a maximum value as shown in FIG. 3(b), the magnetization of the core 22 reaches a saturated state so that the magnetic flux of the magnetic field to be measured is separated from the core 22 and aligned in parallel with the bar-like conductor 21. In this state, the degree of magnetization of the core 22 in the length direction drops in a manner as shown in FIG. 3, and the output (voltage) of the detection coil 23 increases at a position where the rate of change in the magnetization in the length direction is great, and at a position where the rate of change in the exciting current $I_{EX}$ is great and when the current $I_{Ex}$ reaches a maximum value or a minimum value, the output (voltage) of the detection coil 23 becomes zero.

During the state in which the exciting current $I_{EX}$ decreases from the maximum value and reaches the zero-crossing point, as shown in FIG. 2(c), the magnetic flux of the magnetic field to be measured is again allowed to pass through the core 22. When the direction of the exciting current $I_{Ex}$ is reversed, the peripheral face of the core 22 is magnetized in a reverse direction to the circumferential direction as indicated by arrow in FIG. 2(d) and the exciting current $I_{EX}$ decreases to reach a minimum value, the magnetization of the core 22 is again allowed to reach a saturated state; thus, the magnetic flux of the magnetic field to be measured is aligned in parallel with the axial line of the core 22. During this state, the output of the detection coil 23 repeats changes in which it becomes greater in the area where the exciting current $I_{EX}$ is great while it becomes zero when the exciting current $I_{EX}$ reaches the minimum value, with the result that it has a change corresponding to 2 cycles in response to a change in the exciting current $I_{EX}$ corresponding to one cycle.

In other words, the exciting current is allowed to flow through the cylinder-shaped core 22 made of a soft magnetic material so as to excite it in the circumferential direction periodically so that the magnetization in the length direction of the core 22 is switched; thus, the relationship between the core 22 and the magnetic field to be measured is changed from FIG. 2(a) to FIG. 2(b), from FIG. 2(b) to FIG. 2(c) and from FIG. 2(c) to FIG. 2(d). In this state, the density of the magnetic flux, which resides around the detection coil 23, is allowed to change so that, as illustrated in FIG. 3, an output voltage (the phase of the output voltage) corresponding to the intensity (direction) of the magnetic field to be measured is obtained from the detection coil 23.

In an element of such an orthogonal flux-gate type, the flux distribution formed by the exciting current $I_{EX}$ flowing through the rod-like conductor 21 is shown by FIG. 1B. In other words, the magnetic fluxes are formed not only in the core 22 (indicated by a broken line s in the Figure), but also in the circumferential direction (indicated by a broken line t in the Figure) of a space outside the core 22. As a result, most of them only excite the space, and the magnetic flux fails to concentrate the magnetic field on the core 22, resulting in degradation in magnetic efficiency and wasteful consumption of the exciting current $I_{EX}$. Moreover, in the element of orthogonal flux-gate type, since the detection coil 23 is an indispensable member, one portion of the magnetic fluxes (the broken line t in the Figure), generated in the space outside the core 22, come to reside around the detection coil 23, causing an exciting signal to be mixed with the detection output and resulting in degradation in the S/N ratio and resolution. Furthermore, the actual construction of the element of orthogonal flux-gate type is complex as compared with the Hall elements, MR elements, etc., although it is schematically shown in FIGS. 1A and 2 so as to show the principle thereof; therefore, another problem is that it is difficult to miniaturize the construction.

Here, Japanese Patent Application Laid-Open No. 10-90381(1998) has proposed a magnetic detection element shown in FIG. 4. FIG. 4 is a schematic view that shows the construction of the conventional magnetic detection element disclosed by the above-mentioned patent application, in which a bar-like conductor 61 made of a copper wire is coated with an insulating layer 62, and inserted into a soft magnetic tube 63 coaxially, and one end of the bar-like conductor 61 is connected to a ground conductor 65 through a conductor 64. In such a conventional magnetic detection element, a great change in impedance is generated by utilizing a frequency in the vicinity of a resonant point generated by an inductance L and a stray capacitance C by the soft magnetic tube 63, and this change is taken so as to detect the magnetic field.

In the conventional magnetic detection element of this type, the ground conductor 65 forms a LC resonant circuit with the stray capacitance, and is placed in the proximity of the bar-like conductor 61 that forms an inductance so as to eliminate a change in the stray capacitance due to environments. Since this magnetic detection element requires no detection coil, it is originally not necessary to take into consideration the influences from the magnetic fluxes residing around the detection coil. Therefore, it is not necessary to prevent an outward expansion of exciting magnetic fluxes generated from the magnetic detection element.

Here, since this element is a two-terminal element for detecting a change in the impedance with respect to the outside magnetic field, it only responds to the intensity of a magnetic field, and does not respond to the direction of a magnetic field, thereby failing to detect the direction of a magnetic field. Moreover, the magnetic detection element having the above-mentioned construction is characterized in that the change in impedance is detected; therefore, since no magnetic switching is required, the value of a current flowing through the conductor is small, and it is not necessary to take into consideration an increase in power consumption caused by excitation of the space in practical use. Consequently, it is not possible to apply a construction including the above-mentioned magnetic detection element to the element of orthogonal flux-gate type.

BRIEF SUMMARY OF THE INVENTION

An object of the present invention is to provide a magnetic sensor of orthogonal flux-gate type which can achieve a small size and light weight by using a simplified construction, without losing its inherent characteristics as an element of orthogonal flux-gate type, and a manufacturing method of such a magnetic sensor.

Another object of the present invention is to provide a magnetic sensor of orthogonal flux-gate type which can achieve a great reduction in power consumption and provide a high sensitivity, without losing its inherent characteristics as an element of orthogonal flux-gate type, and a manufacturing method of such a magnetic sensor.

The magnetic sensor of the present invention has an arrangement in which a high-frequency current is allowed to flow through an internal conductor that is placed inside a cylindrical core made of a soft magnetic material so that a magnetic field to be measured residing around a detection coil wound up on the core is changed, and the intensity and direction of the magnetic field to be measured is detected on the basis of an output of the detection coil. In this arrangement, the magnetic sensor is further provided with an external conductor placed around of the core, which is electrically connected to the internal conductor.

Since the external conductor is placed around the core, no space is magnetized by the magnetic field generated by the current flowing through the internal conductor so that the magnetic field can be concentrated on the core; thus, it is possible to improve the magnetic efficiency, and consequently to cut the exciting current. Moreover, since the magnetic field, formed by the flow of the exciting current, can be concentrated on the core, it is possible to efficiently excite the core even by the use of low power, and also to improve the S/N ratio by preventing an exciting signal from being mixed with the output signal of the detection coil. Furthermore, since the entire core, that is, not only the surface thereof, but also the inside thereof, can be magnetically excited in a uniform manner, it is possible to eliminate the generation of a residual magnetic field and the resulting hysteresis, and consequently to obtain high measuring precision.

In the above-mentioned magnetic sensor, the external conductor is placed at least two positions that faces each other with the core located in between. Since the side faces at two corresponding positions of the core are covered with the external conductor, the sensor has a simplified structure, can be easily manufactured in a small size, and can correctly detect the intensity and direction of a magnetic field.

In the above-mentioned magnetic sensor, the external conductor has an arrangement in which two ends of a channel member are closed with end plates having holes for allowing the internal conductor to pass through them. Thus, since the external conductor is formed by the channel member, the structure is simplified and it becomes possible to easily manufacture the sensor.

In the above-mentioned magnetic sensor, the external conductor is formed into a cylindrical shape. Since the external conductor is formed into the cylindrical shape, the entire periphery of the core can be covered with the external conductor; thus, it is possible to easily magnetize the core, to reduce the power consumption, and also to provide a structure with high rigidity that is less susceptible to impact, vibration, etc., as well as a high production efficiency in mass production.

In the above-mentioned magnetic sensor, the internal conductor is formed into a column shape, and both the external conductor and core are formed into a cylindrical shape. The magnetic field, which is formed by magnetizing the core by the exciting current, is not allowed to expand in space, and concentrated on the core; therefore, it is possible to efficiently excite the core even by the use of low power, and also to improve the S/N ratio by preventing an exciting signal from being mixed with the output signal of the detection coil. Furthermore, since the entire core, that is, not only the surface thereof, but also the inside thereof, can be magnetically excited in a uniform manner, it is possible to eliminate the generation of a residual magnetic field and the resulting hysteresis, and consequently to obtain high measuring precision.

In the above-mentioned magnetic sensor, one or a plurality of slits, extending in the axis length direction, are formed in the peripheral wall of the external conductor. Since the slits are formed in the external conductor, it is possible to prevent an eddy current from being generated in the external conductor, and consequently to prevent a reduction in the output.

In the above-mentioned magnetic sensor, the internal conductor and the external conductor are integrally connected with the respective ends on the same side being electrically connected. Since the respective ends on the same side of the internal conductor and external conductor are integrally connected, it is possible to obtain high rigidity in structure, and consequently to obtain stable measuring precision.

In the above-mentioned magnetic sensor, the core is formed by a tube made of permalloy or sendust. Therefore, a cylindrical core having a small diameter with high precision can be manufactured at low costs with high productivity.

The method of manufacturing the magnetic sensor of the present invention is provided with steps of: obtaining a cylindrical core made of a soft magnetic material; inserting and securing an internal conductor into the core with an insulating coat film interpolated between these; externally fitting and securing a cylindrical external conductor having slits in its axis length direction onto the periphery of the core with an insulating material interpolated between these; and winding a detection coil on the periphery of the external conductor. In the manufacturing method of the present invention, it is possible to mass product magnetic sensors with high precision at low costs with uniform quality without irregularities in precision.

In the above-mentioned manufacturing method of the magnetic sensor, the cylindrical core made of a soft magnetic material is formed by a tube made of permalloy. Thus, it is possible to obtain a cylindrical core having a great permeability even with a small coercive force. Moreover, it becomes possible to mass manufacture products with stable precision.

In the above-mentioned manufacturing method of the magnetic sensor, the tube made of permalloy is subjected to a heating treatment for several hours in a range of 1000° C. to 1200° C. so as to improve its soft magnetic property. Thus, it is possible to eliminate machining distortion, and consequently to obtain a tube having a preferable soft magnetic property. Since the uniform soft magnetic property is obtained, it is possible to reduce irregularities in precision, and also to greatly improve the resolution.

The above and further objects and features of the invention will more fully be apparent from the following detailed description with accompanying drawings.

BRIEF DESCRIPTION OF THE SEVERAL VIEWS OF THE DRAWINGS

FIGS. 11A to 11G are explanatory drawings that show processes of a manufacturing method (the fourth embodiment) for a magnetic sensor of the present invention.

FIGS. 12A to 12E are explanatory drawings that show processes of a manufacturing method (the fifth embodiment) for a magnetic sensor of the present invention.

DETAILED DESCRIPTION OF THE INVENTION

First Embodiment

Figure 1A:
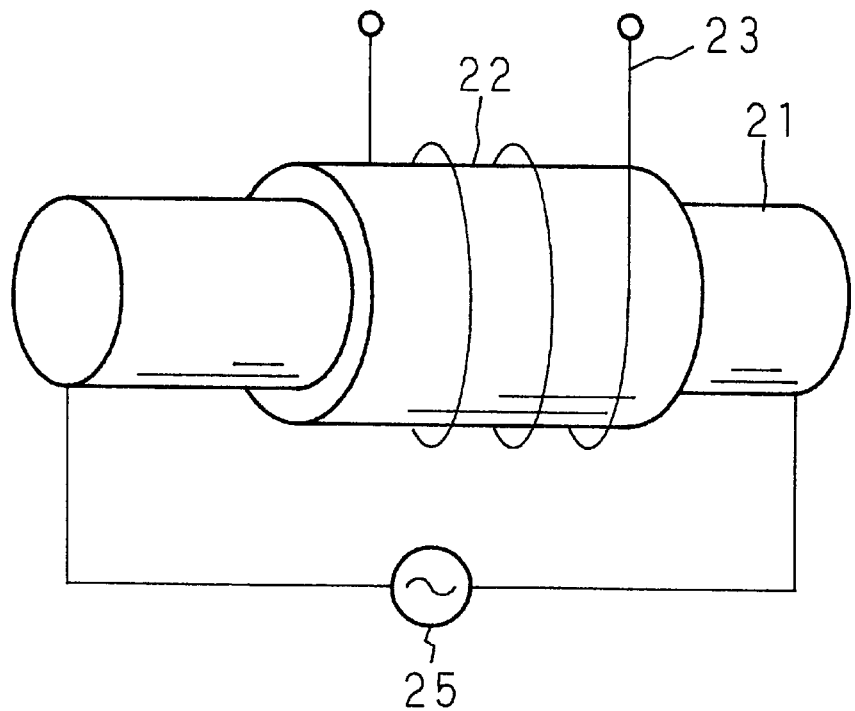
FIG. 1A is an explanatory drawing that shows the principle of an element of orthogonal flux-gate type.
Figure 1B:
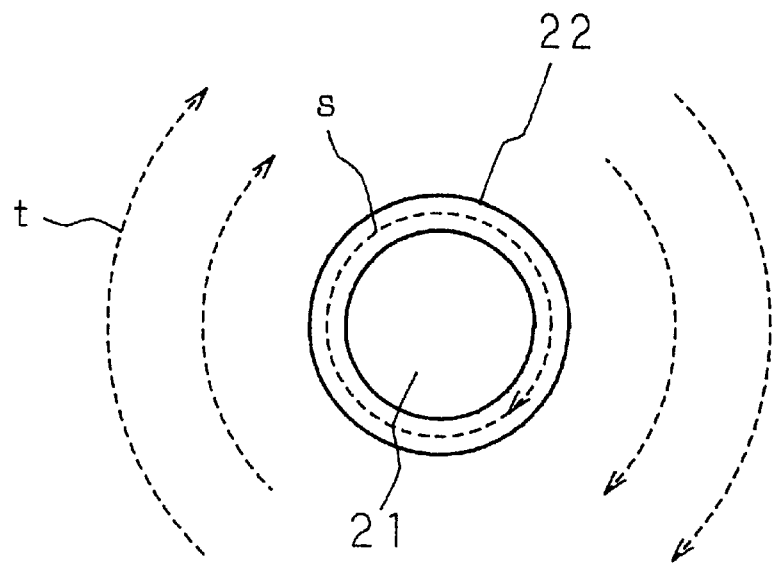
FIG. 1B is an explanatory drawing that shows a magnetic flux formed in a core.
Figure 2:
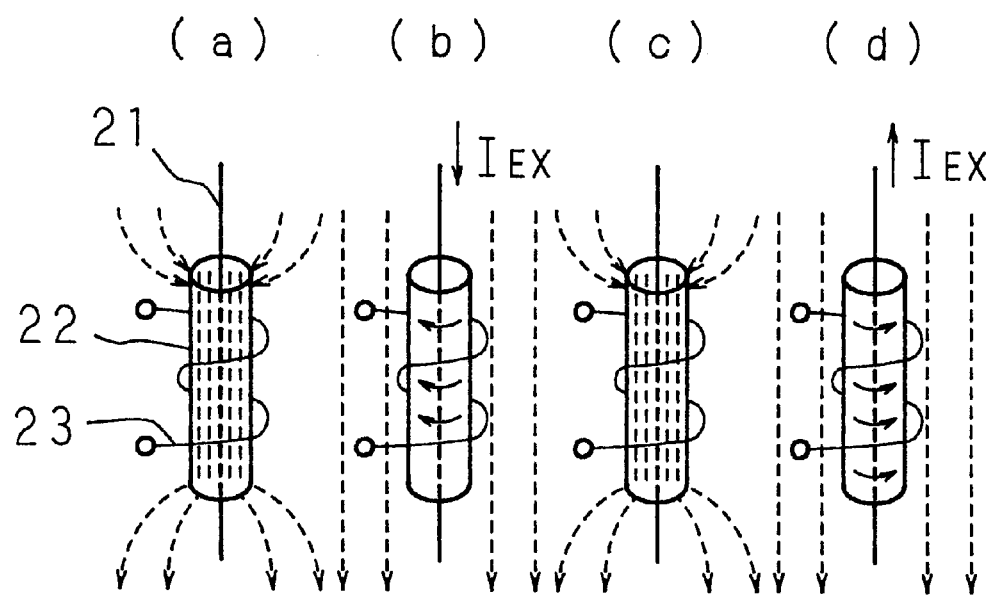
FIG. 2 is an explanatory drawing that shows the operation of the element of orthogonal flux-gate type shown in FIG. 1A.
Figure 3:
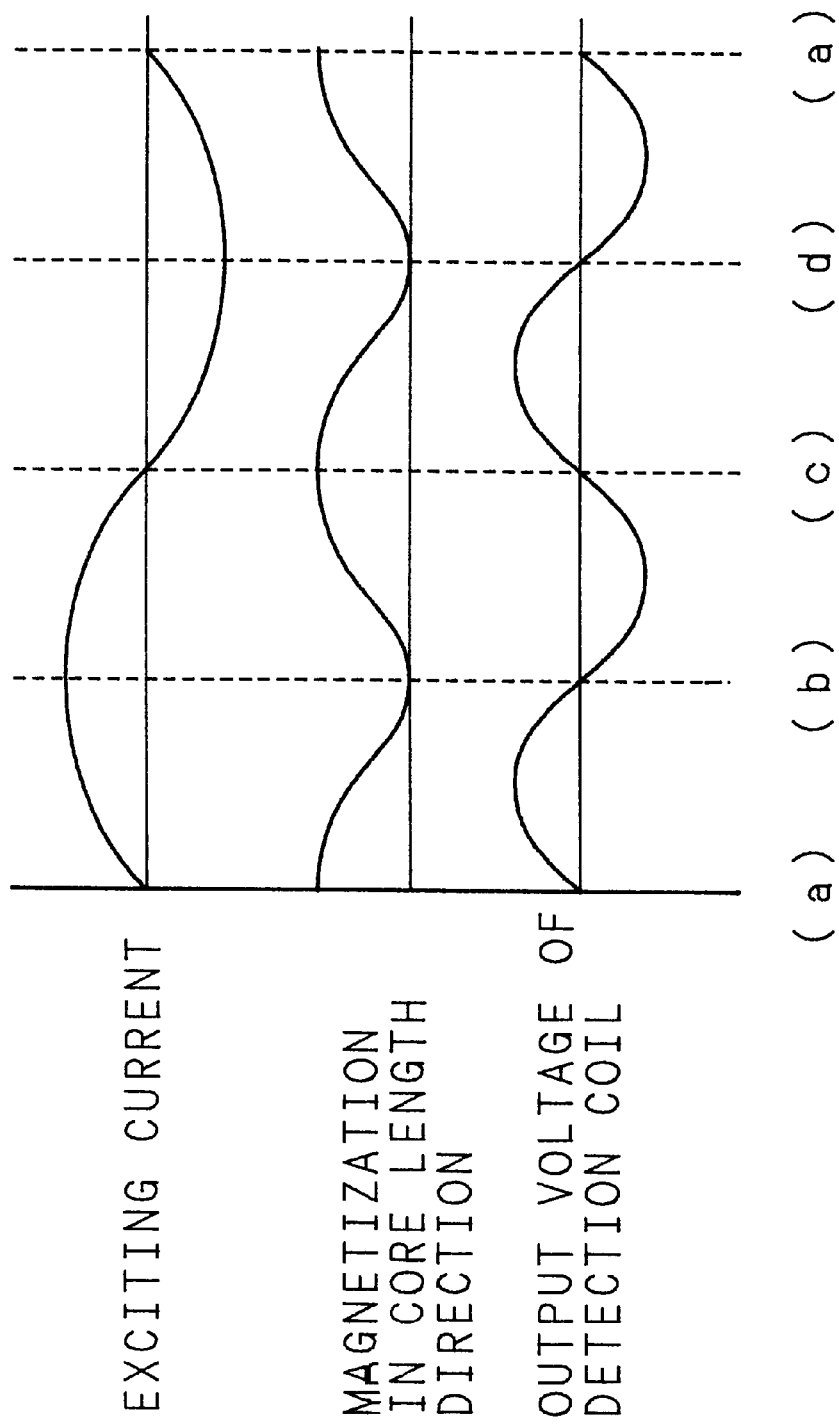
FIG. 3 includes waveform diagrams of an exciting current, a magnetization in the longitudinal direction and an output voltage of a detection coil of the element of orthogonal flux-gate type of FIG. 1A.
Figure 4:
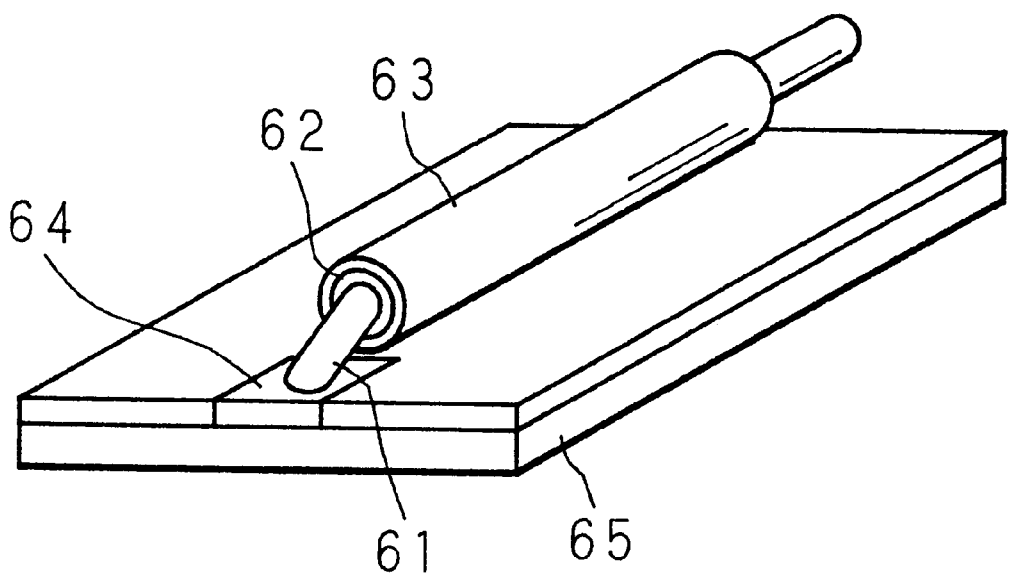
FIG. 4 is a schematic drawing that shows a conventional magnetic detection element.
Figure 5:
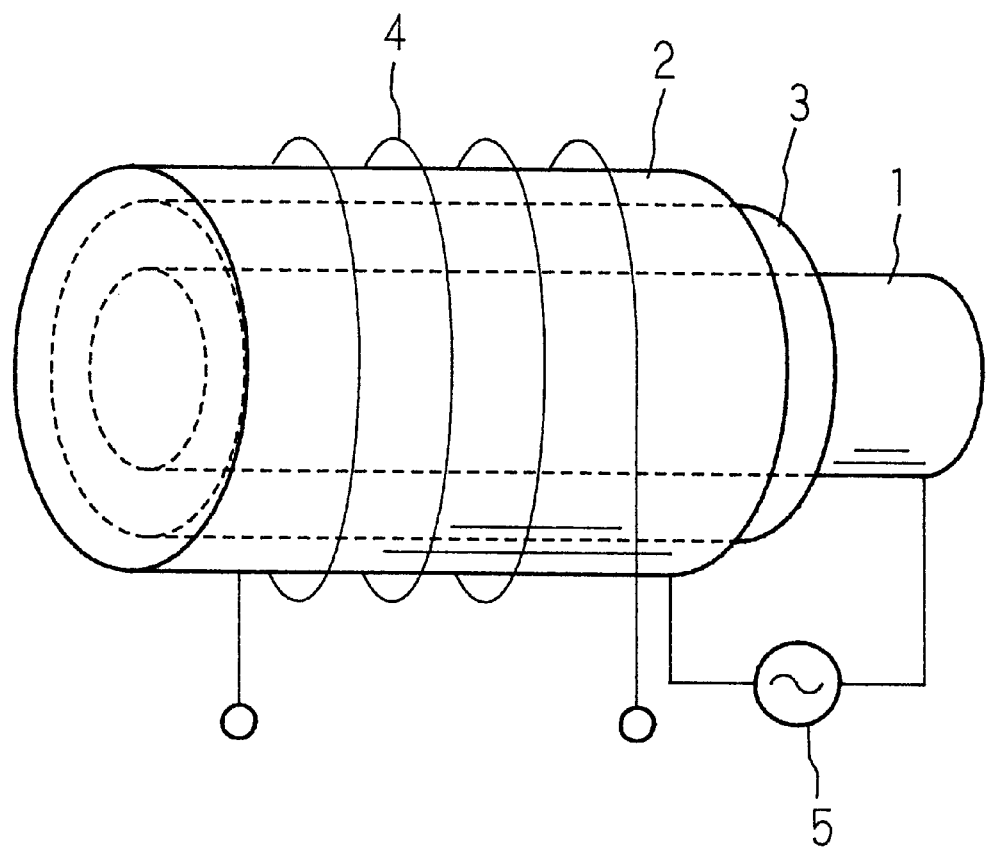
FIG. 5 is a schematic drawing that shows the construction of a magnetic sensor of the first embodiment.
Figure 6A:
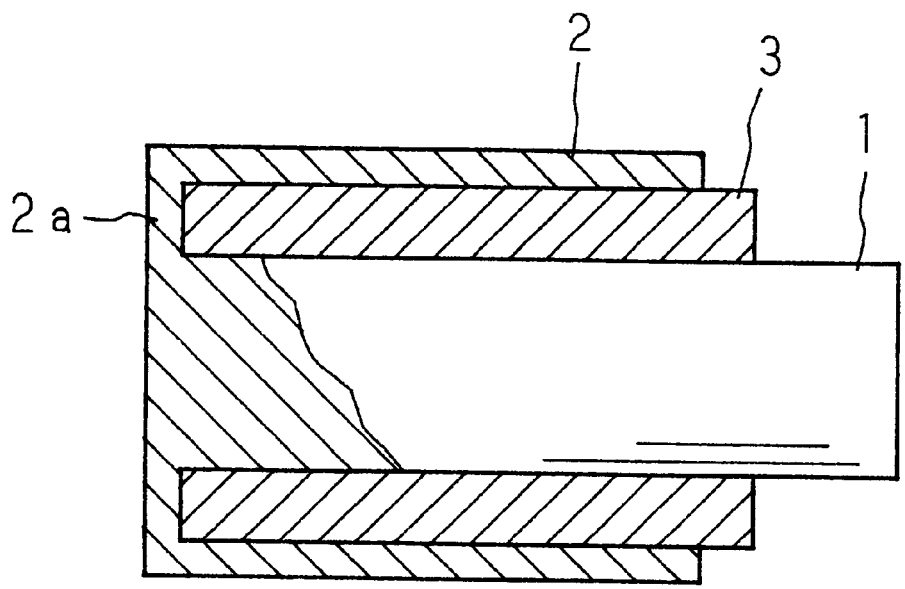
FIG. 6A is a longitudinal cross-sectional view of the magnetic sensor shown in FIG. 5.
Figure 6B:
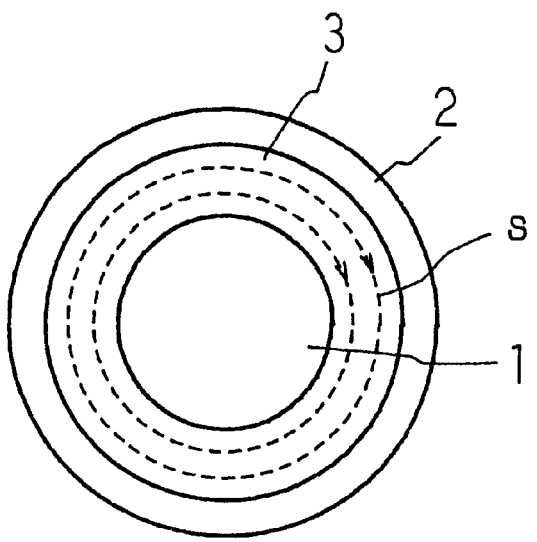
FIG. 6B is a side view of the magnetic sensor shown in FIG. 5.

FIG. 5 is a schematic view that shows the construction of a magnetic sensor of orthogonal flux-gate type in accordance with the first embodiment of the present invention; FIG. 6A is a cross-sectional view (in which a detection coil is not shown) that shows the construction of the first embodiment; and FIG. 6B is a view that shows the construction of FIG. 6A viewed from the right side (in which the detection coil is not shown). In these Figures, reference numeral 1 is an internal conductor, 2 is an external conductor, 3 is a core, 4 is a detection coil, and 5 is a high-frequency power source.

The internal conductor 1 is made of a known metal or another conductive material, and formed into a column shape. In particular, the internal conductor 1 is preferably made of a non-magnetic material so as not to give adverse effects on the core 3 due to offset and hysteresis caused by residual magnetization; and for example, the material is selected from Cu, Al, etc. Moreover, from the same viewpoint as the internal conductor 1, the external conductor 2 is also selected from conductive materials, and formed into a cylindrical shape with an inner diameter larger than the diameter of the internal conductor 1. The internal conductor 1 and the external conductor 2 are placed in a coaxial manner with the internal conductor 1 located inside and the external conductor 2 located outside with an insulating material interpolated between them, and respective ends on the same side of the internal conductor 1 and the external conductor 2 are electrically connected to each other with an end plate 2a. The respective ends of the internal conductor 1 and outer conductor 2 are integrally secured to the surface of the end plate 2a by soldering or welding.

The other end of the internal conductor 1 is positioned in a manner so as to stick outward with a predetermined length from the other end of the external conductor 2. An insulating material is affixed onto the outer circumferential face of the internal conductor 1, the inner and outer circumferential faces of the external conductor 2 and the inner circumferential face of the end plate 2a by means of vapor deposition or coating. The insulating material is placed so as to maintain an electrical insulation between the opposing faces of the internal conductor 1 and the external conductor 2. Here, in order to obtain the effects of the magnetic sensor of the present invention more preferably, it is effective to maintain insulation between the internal conductor 1 and the core 3, and in order to provide preferable productivity, etc., it is effective to coat the outer circumferential face of the internal conductor 1 with the insulating material.

Here, inside a cylindrical space section formed between the internal conductor 1 and the external conductor 2, the core 3, formed into a cylindrical shape with a soft magnetic material such as permalloy (Ni—Fe alloy), sendust (Fe—Al—Si alloy) or soft ferrite, is inserted and fitted. The material of the cylindrical core 3 is a soft magnetic material, and required to have a proper soft magnetic property (that is, a coercive force as small as possible with a great permeability). Permalloy (Ni—Fe alloy) is the best material so as to satisfy this requirement, followed by sendust (Fe—Al—Si alloy) and then soft ferrite (for example, Mn—Zn system ferrite). Either of the above-mentioned materials may be used for the cylindrical core related to the present invention, and from the viewpoint of a machining property (for minimizing the diameter) and a soft magnetic property, permalloy is the best material followed by sendust; thus, a preferable tube shape is obtained. Here, from the viewpoint of a machining property, the permalloy is the best material. However, permalloy tends to cause degradation in the soft magnetic property due to distortion resulting from machining; therefore, it is preferable to improve the soft magnetic property by subjecting it to a heating treatment (magnetic annealing) after the machining. Additionally, sendust is inherently less susceptible to machining distortion, and needs not be subjected to the heating treatment.

One end of the core 3 is inserted to such a position as to contact the inner circumferential face of the end plate 2a, and the other end thereof is allowed to protrude with a predetermined length from the other end of the external conductor 2. It is not necessary to provide a closely contact state among the core 3, the internal conductor 1 and the external conductor 2, and these members may be maintained in a freely rotatable state with proper idle spaces from each other. The detection coil 4 is wound up around the periphery of the external conductor 2 a predetermined times, and the high-frequency power source 5 is connected between the other ends of the internal conductor 1 and the external conductor Here, the present embodiment has exemplified the case in which the inner conductor 1 is formed into a column shape and the external conductor 2 and the core 3 are respectively formed into a cylindrical shape; however, the shapes of these members are not particularly limited by these shapes, and they may of course be formed into, for example, a square shape, a pentagonal shape or another polygonal shape.

In FIG. 6B, a magnetic field, which is formed when a high-frequency current is allowed to flow between the internal conductor 1 and the external conductor 2 in the magnetic sensor of orthogonal flux-gate type shown in FIG. 5, is indicated by a broken line s with an arrow. As clearly shown by this Figure, an excited magnetic field, formed by an exciting current flowing through the internal conductor 1 and an exciting current flowing through the external conductor 2, is only generated between the internal conductor 1 and the external conductor 2 without magnetizing any space; thus, it is possible to concentrate the magnetic field on the core 3, and consequently to carry out a magnetizing process at low power without any losses. In other words, by placing the external conductor 2 around the core 3 effectively, the excited magnetic flux leaking outside the external conductor 2 is reduced to substantially zero, and the aforementioned effects are thus obtained.

Figure 7:
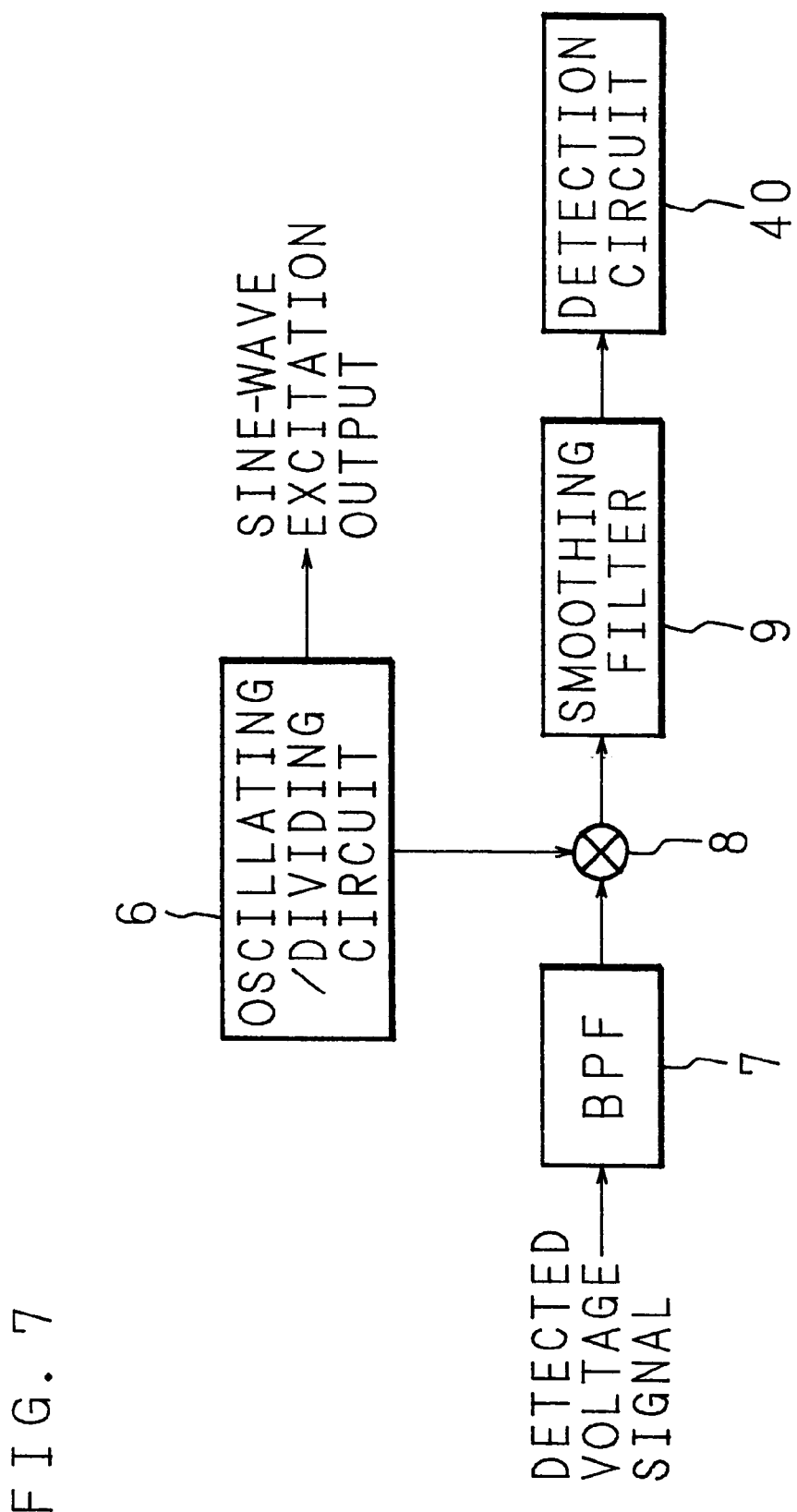
FIG. 7 is a block diagram that shows the construction of a detection unit.

FIG. 7 is a block diagram that shows the construction of a detection unit connected to the detection coil 4, and in this Figure, reference numeral 6 represents an oscillating/dividing circuit. Two kinds of high-frequency powers of 7 kHz and 14 kHz are outputted from the oscillating/dividing circuit 6, and the high-frequency wave of 7 kHz is applied to the internal conductor 1 and the external conductor 2 as a sine-wave exciting current, and the high-frequency wave of 14 kHz is applied to a phase sensitive detector 8. A voltage signal that is a detection signal of the detection coil 4 is inputted to a band-pass filter (BPF) 7 at which noise is eliminated therefrom, and inputted to the phase sensitive detector 8 at which the phase is detected, and then inputted to a smoothing filter 9. The smoothing filter 9 smoothes the phase-detected signal inputted thereto, and outputs a positive or negative detection signal corresponding to the intensity and direction of the magnetic field to a detection circuit 40. Thus, the detection circuit 40 detects the intensity and direction of the magnetic field based upon the detection signal.

Second Embodiment

Figure 8A:
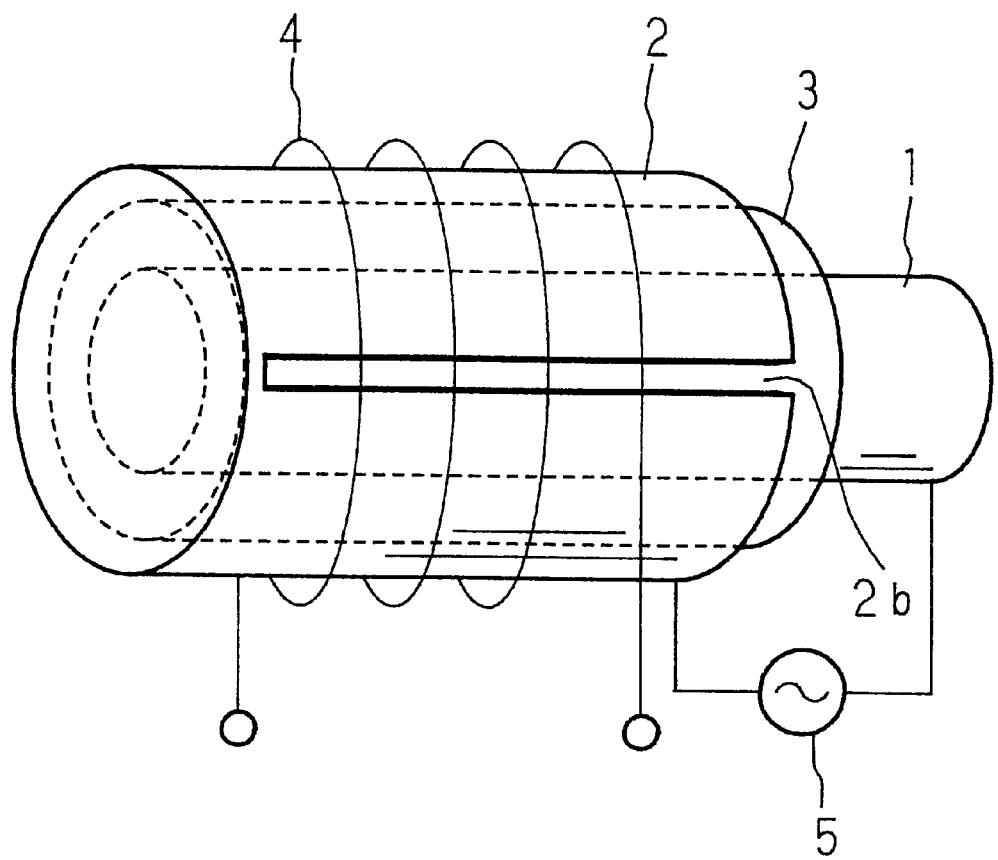
FIG. 8A is a perspective view showing the construction of a magnetic sensor of the second embodiment.
Figure 8B:
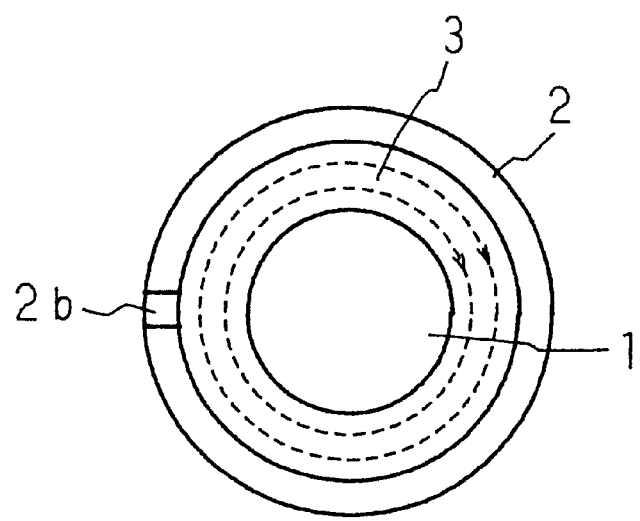
FIG. 8B is a side view of FIG. 8A.

In the second embodiment, a slit extending in the axis length direction is formed in one portion in the circumferential direction of the external conductor 2. FIG. 8A is a perspective view showing the construction of the second embodiment, FIG. 8B is a side view thereof (in which the detection coil 4 is not shown). Other members, such as the internal conductor 1, the external conductor 2, and the core 3, have substantially the same constructions as those of the first embodiment; and the corresponding members are represented by the same reference numbers and the description thereof is omitted. In the second embodiment, since a slit 2b is formed, it is possible to prevent an eddy current from being generated on the surface of the external conductor 2, and consequently to effectively prevent a reduction in the output voltage and an increase in noise due to the generation of the eddy current.

Third Embodiment

Figure 9A:
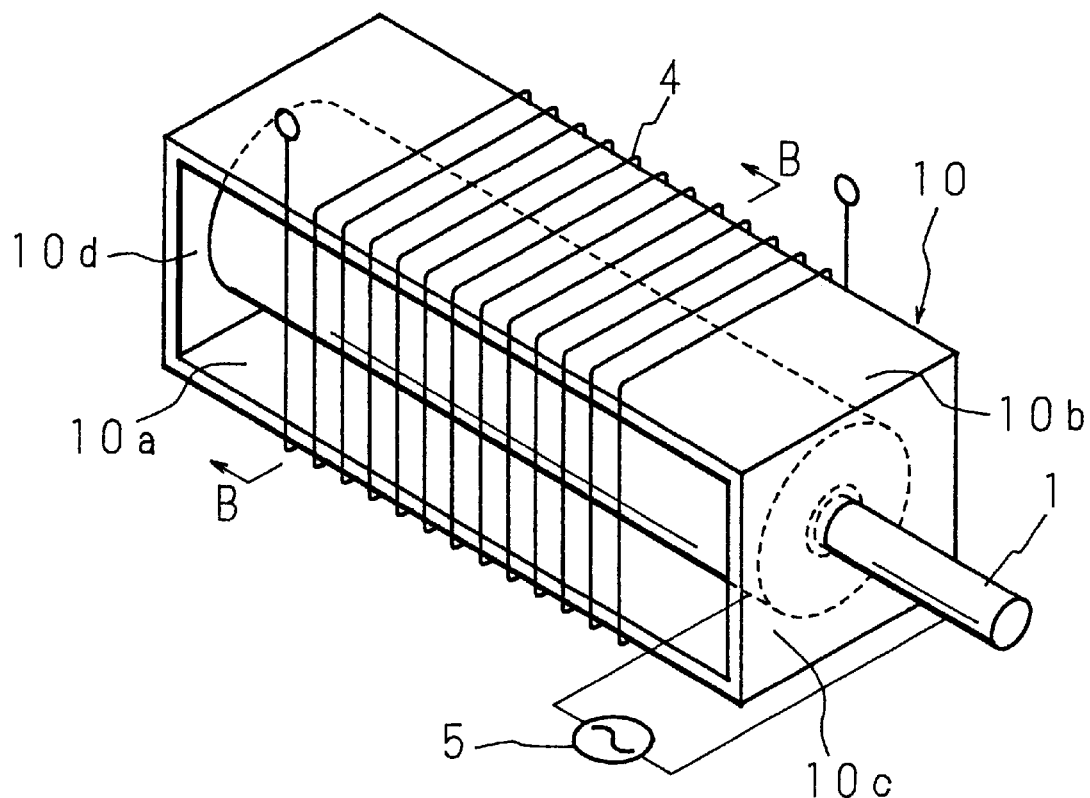
FIG. 9A is a schematic drawing that shows the construction of a magnetic sensor of the third embodiment.
Figure 9B:
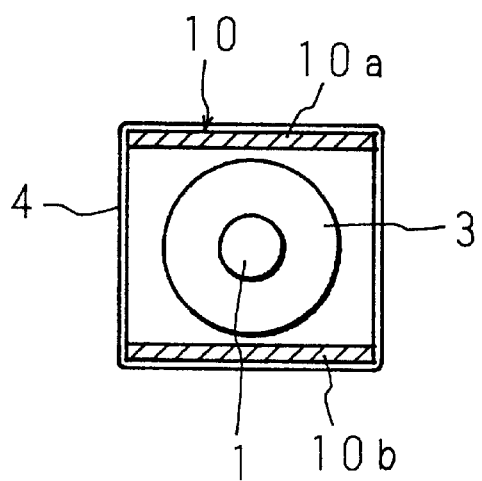
FIG. 9B is a cross-sectional view taken along line B—B of FIG. 9A.

In the third embodiment, the external conductor is constituted by a pair of parallel conductors, and covers the core 3 with two side faces that face each other with the core 3 located in between. FIG. 9A is a schematic drawing that shows the construction of the third embodiment, and FIG. 9B is a cross-sectional view taken along line B—B of FIG. 9A. In the Figures, reference numeral 1 is an internal conductor, 10 is an external conductor, 3 is a core, 4 is a detection coil, and 5 is a high-frequency power source.

Parallel plate-shaped conductors 10a and 10b, which constitute the external conductor 10, and are made by a conductive material, are integrally connected to each other at their ends by end plates 10c and 10d that are made by the same conductive material, and a hole is opened in each of the end plates 10c and 10d in the center thereof. The core 3, which is formed into a cylindrical shape with a soft magnetic material, is placed between the parallel conductors 10a and 10b, and also interpolated between the end plates 10c and 10d with its length direction being coincident with the length direction of the external conductor 10. The internal conductor 1 is inserted into the core 3 from the end plates 10c through its hole, and with one end of the internal conductor 1 being inserted into the hole of the end plate 10c, this portion is soldered or brazed, with the other end of the internal conductor 1 sticking outward from the end plate 10d with a predetermined length. In the third embodiment, the formation of the external conductor 10 is easily carried out, and the entire assembling processes are also easily carried out.

Figure 9C:
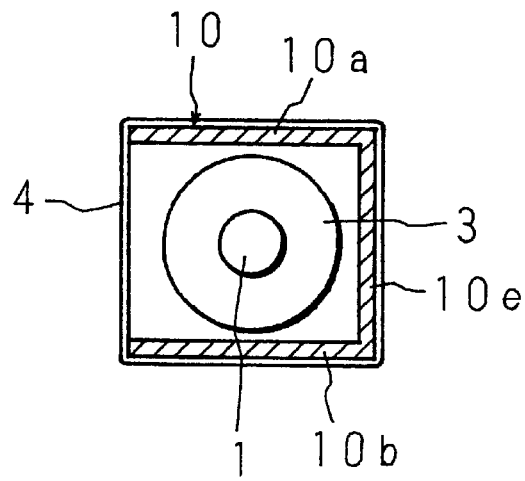
FIG. 9C is a cross-sectional view that shows another construction of the magnetic sensor of the third embodiment.

FIG. 9C, which shows another construction of the external conductor 10, is a cross-sectional view that corresponds to FIG. 9B, and the external conductor 10 is constituted by a channel member having a concave shape in its cross-section with its both ends in the length direction being closed by end faces. The other members such as the internal conductor 1, the core 3, the detection coil 4, etc., have substantially, the same constructions as those shown in FIGS. 9A and 9B. In this arrangement of the external conductor 10, the core 3 is covered with the parallel conductors 10a and 10b constituting the external conductor 10, and a conductor 10e connecting these; thus, magnetic lines of force at the time of magnetizing the core 3 are allowed to enter the parallel conductors 10a and 10b and the conductor 10e so as to magnetize these. Therefore, the magnetic field can be further concentrated on the core 3 and it becomes possible to carry out an efficient magnetizing process at low power.

Figure 10A:
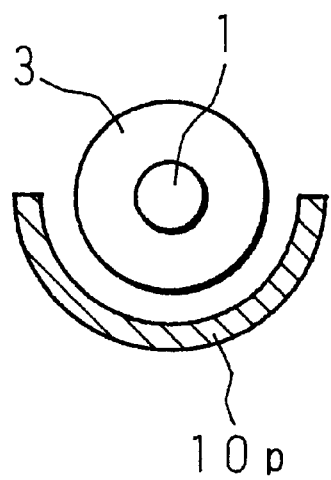
FIG. 10A is a schematic drawing that shows another construction of the external conductor.
Figure 10B:
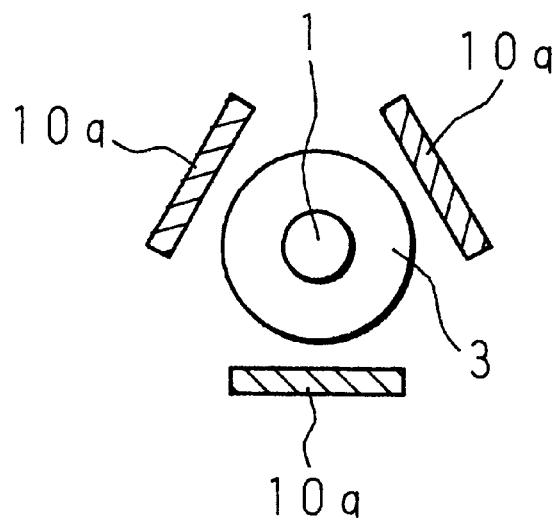
FIG. 10B is a schematic drawing that shows still another construction of the external conductor.

Here, with respect to the external conductor 10 in the third embodiment, in addition to the construction shown in FIG. 9B or FIG. 9C, an external conductor 10p having a semi-cylindrical shape in its cross-section as shown in FIG. 10A may be adopted, or plate-shaped external conductors 10q, placed in the three directions with an angle of 120° from each other in the circumferential direction as shown in FIG. 10B, may be adopted.

In other words, these arrangements and constructions of the external conductor make it possible to reduce excited magnetic fluxes leaking outside the external conductor, and it is preferable to use the construction in which the external conductor completely surrounds the periphery of the core as shown in FIG. 5; however, depending on the productivity, required precision, etc., various constructions other than the above-mentioned constructions may be adopted. Examples thereof include a construction in which an odd number of plate-shaped external conductors 10, such as 3, 5 or 7 number of them, are placed around the core 3, or an even number of plate-shaped external conductors 10, such as 4, 6, or 8 of them, are placed around the core 3.

Fourth Embodiment

The fourth embodiment is a manufacturing method for the magnetic sensor shown in FIGS. 9A and 9B as the third embodiment. FIGS. 11A to 11G are explanatory drawings that show main manufacturing processes of the magnetic sensor. First, as illustrated in FIG. 11A, a plate of 3 mm in width, 7 to 8 mm in length and 0.013 mm in thickness, which was made of permalloy, was prepared. This plate was folded into a cylindrical shape with both of the side edges in the width direction being allowed to contact each other, and as illustrated in FIG. 11B, both of the contact edges were connected to each other by means of spot welding so that a core 3 having a cylindrical shape with an inner diameter of 0.8 mm and a length of 8 mm, was formed, and this was subjected to a heating treatment (annealing) at 1100° C. for three hours, as illustrated in FIG. 11C.

Next, a pair of parallel conductors made of Cu, which face each other with the core 3 interpolated in between, were closed at its respective ends by end plates 10c and 10d and a round hole was formed in each of the end plates 10c and 10d in the center thereof; thus, an external conductor 10 was formed, and the core 3 was housed inside thereof. Then, as illustrated in FIG. 11D, the holes of the respective ends of the core 3 were aligned from the inside thereof to face holes 10f and 10g of the end plates 10c and 10d of the external conductor 10, and in this state, a bar-like internal conductor 1 was allowed to penetrate the hole 10f, the core 3 and the hole 10g in this order from one end of the external conductor 10. Then, the leading end was integrally secured to the peripheral edge of the hole 10g by means of brazing or welding, as illustrated in FIG. 11E. The portion of the internal conductor 1 which comes in contact with the core 3 is provided with an electrical insulating material. In this state, the base end portion of the internal conductor 1 was maintained in a manner so as to extend before the hole 10f with a predetermined length.

Next, as illustrated in FIG. 11G a bobbin 19 made of an insulating material, which has a square shape, in its cross-section, of 3 mm in each of the lateral and longitudinal sides and 8 mm in length on its middle portion, and also has collar edges 19a and 19b on the periphery portions of the respective ends, was prepared, and a lead wire having a diameter of 90 μm was wound around the peripheral face thereof 100 times so as to attach a detection coil 4 thereto, and this was then externally secured to the external conductor 10 to which the core 3 and the internal conductor 1 had been attached as shown in FIG. 11F. Thus, in principle, the same magnetic sensor as shown in the third embodiment was manufactured.

Fifth Embodiment

FIGS. 12A to 12E are explanatory drawings that show main manufacturing processes of a magnetic sensor that are suitable for mass producing the magnetic sensor of the present invention. First, a tube 30 made of permalloy was prepared, as illustrated in FIG. 12A. The material of the tube 30 was made up of Ni: 80 wt %, Mo; 5 wt % and Fe. The tube 30 was manufactured in the following sequence: An elongated belt-shaped plate made of the above-mentioned composition, having a thickness of 0.18 mm and a width of 12. 8 mm, was bent from one end side in the width direction in a manner so as to fold, and both of the edges in the width direction were allowed to contact each other; and in this state, the contact portion was welded so as to obtain a seam welded pipe made of permalloy; and this was then subjected to a draw machining process by using a plug and die. The resulting tube 30 was subjected to a soft annealing (at 800° C. to 1000° C., for one to five minutes and in a hydrogen atmosphere) so as to conduct following processes easily, and again subjected to a wire drawing process; thereafter, this was cut into predetermined lengths so as to obtain tubes 31 having a predetermined soft magnetic property. Next, as illustrated in FIG. 12B, the resulting tube 31 was subjected to a heating treatment (magnetic annealing) so as to improve the soft magnetic property.

The above-mentioned heating treatment (magnetic annealing) was carried out in an atmosphere of Ar or another inert gas in a temperature range of 1000° C. to 1200° C. (more preferably, 1100° C. to 1150° C.) for 1 to 4 hours (more preferably, for 3 hours). The conditions of the heating treatment for the tube 31 and the resulting magnetic properties are shown in Table 1.

TABLE 1

| Heating treatment temperature/hours | | 1 hr | 2 hr | 3 hr | 4 hr |
|---|---|---|---|---|---|
| 1000° C. | Hc | 700 mOe | 180 mOe | 55 mOe | 45 mOe |
|  | μm | 5,000 | 20,000 | 65,000 | 80,000 |
| 1100° C. | Hc | 100 mOe | 30 mOe | 10 mOe | 8 mOe |
|  | μm | 25,000 | 100,000 | 450,000 | 550,000 |
| 1200° C. | Hc | 70 mOe | 20 mOe | 8 mOe | 6 mOe |
|  | μm | 35,000 | 220,000 | 560,000 | 746,000 |

Material: Ni; 80 wt %, Mo; 5 wt %, Fe
The heating treatment was carried out in a hydrogen atmosphere, followed by a cooling process.
Hc: Coercive force, μm; Maximum specific permeability As clearly seen from Table 1, various magnetic properties are obtained by the heating treatment temperature and heating treatment time; therefore, the heating treatment temperature and heating treatment time may be properly selected depending on magnetic properties, such as the coercive force Hc and maximum specific permeability μm, required. The tube 31 thus obtained had properties such as, for example, tensile strength: 69.9 kg/mm$^2$, rate of extension: 35.8%, and hardness (Hv): 162 (1 kg). Moreover, the dimensions of the tube 31 are, for example, shown in the following Table 2:

TABLE 2

| Machining dimension | | | |
|---|---|---|---|
| Outer diameter mm | Inner diameter mm | Thickness mm | Length mm |
| 0.4 | 0.24 | 0.08 | 10 |
| 0.3 | 0.14 | 0.08 | 10 |

The above-mentioned heating treatment allows the tube 31 to have uniform soft magnetic properties as a whole. Next, as illustrated in FIG. 12C, a wiring material 32 made of Mo, which serves as an internal conductor and is coated with an insulating film 33 made of Al$_2$O$_3$, was inserted to the inside of the tube 31 having been subjected to the heating treatment from one end thereof, and this was integrally secured thereto by using a bonding agent, etc in a state where the wiring material 32 and the insulating film 33 were allowed to stick out on the leading end side with a predetermined length.

Next, as illustrated in FIG. 12D, onto the periphery of the tube 31 with the internal conductor fitted and secured to the inside thereof, a cylinder body 34, which forms an external conductor, is made of Cu with a thickness of 0.1 mm, and has a slit 34a formed at one portion in the circumferential direction thereof in a manner so as to extend in the axis length direction along the entire length, is externally fitted. An insulating material is affixed on the inner circumferential face of the cylinder body 34 or the outer circumferential face of the tube 31, and the cylinder body 34 is bonded and secured to the outer circumferential face of the tube 31 with the insulating material interpolated in between. The cylinder body 34 is secured in a manner so as to be separated by the slit 34a. Thereafter, as illustrated in FIG. 12E, the wiring material 32 made of Mo, which sticks out from one end of the tube 31, is bent over and this is soldered onto the outer circumferential face of one end of the cylinder body 34. A detection coil 35, coated with an insulating film, is wound along the outer circumferential face of the cylinder body 34; thus, the respective ends form detection output terminals. Moreover, a terminal 34b is soldered on the outer circumferential face of the other end of the cylinder body 34, and a high-frequency power source is connected between this terminal 34b and the wiring material 32 made of Mo that serves as the internal conductor. As described above, in principle, the same magnetic sensor as described in the second embodiment is manufactured.

Figure 13:
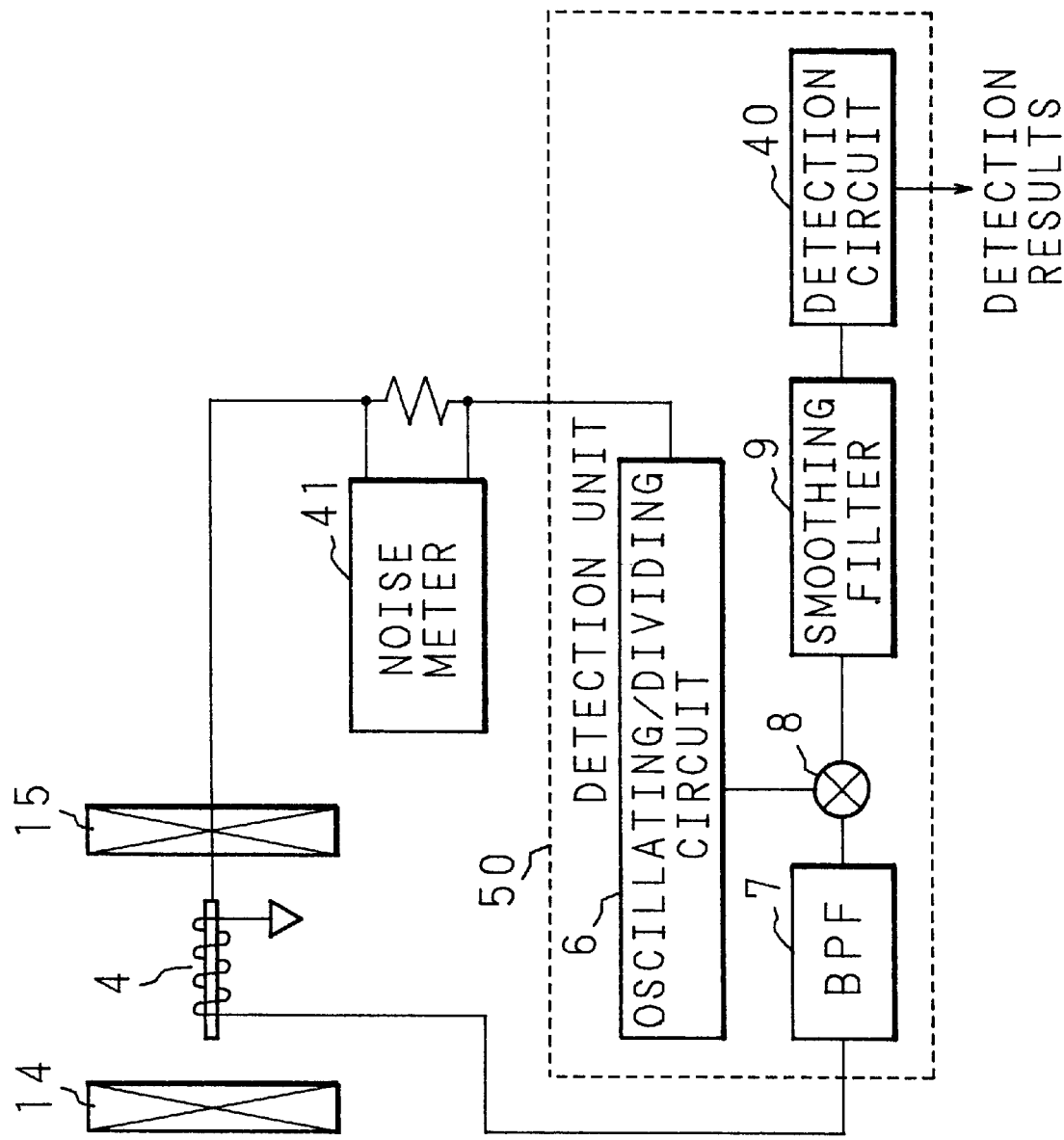
FIG. 13 is a block diagram that shows the construction of a test circuit.
Figure 14:
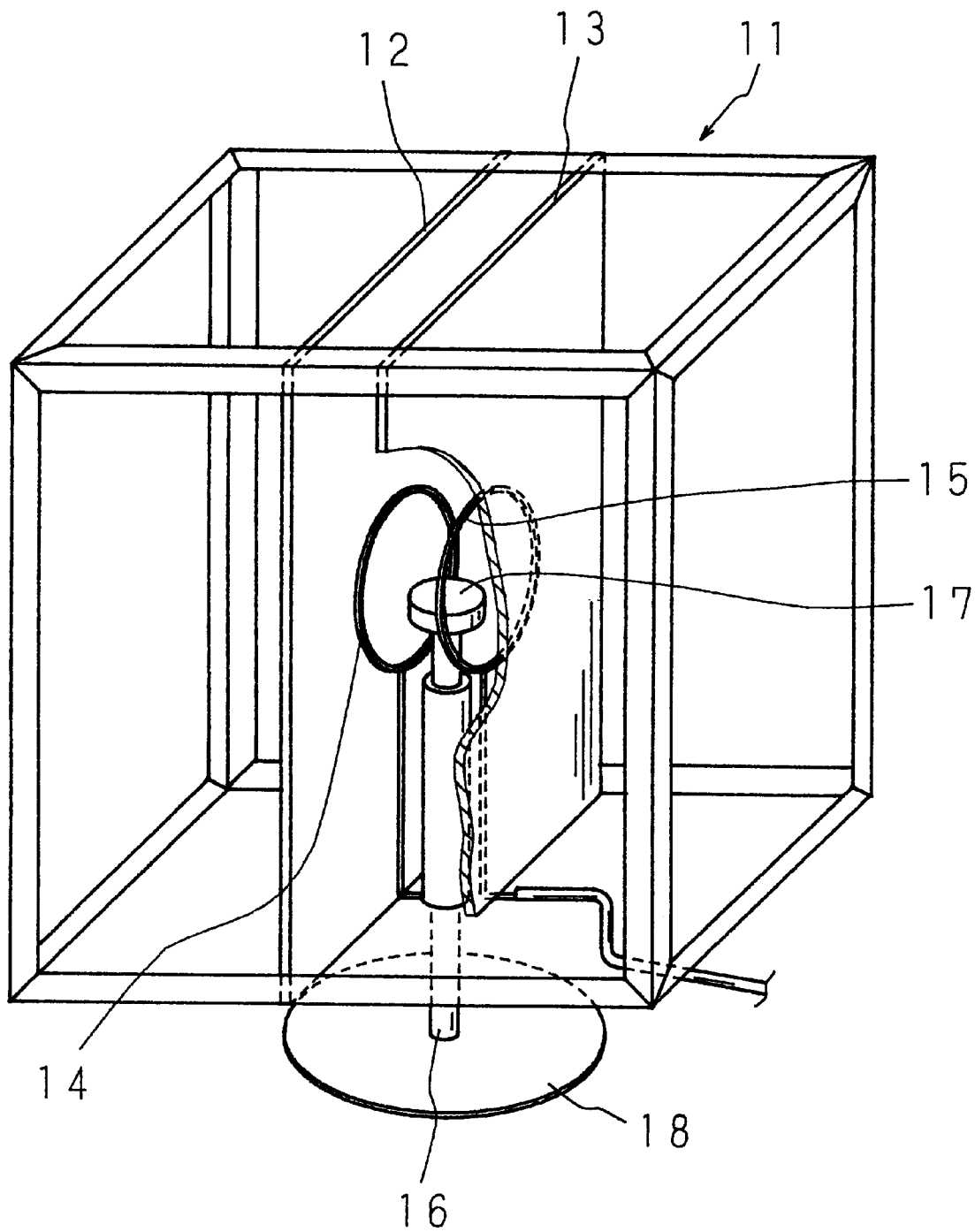
FIG. 14 is a schematic drawing that shows the construction of a testing device.

The following description will discuss the results of tests that were carried out on the magnetic sensors manufactured in accordance with the fourth and fifth embodiments by using a test circuit and a testing device as shown in FIG. 13 and FIG. 14.

FIG. 13 is a block diagram that shows the construction of the test circuit, and as illustrated in FIG. 14, a magnetic sensor is placed on a mounting base installed between Helmholtz coils 14 and 15, and the detection coil 4 of the magnetic sensor is connected to a detection unit 50. Two kinds of high-frequency power of 7 kHz and 14 kHz are outputted from the oscillating/dividing circuit 6 in the detection unit 50, and of these, the high-frequency of 7 kHz is applied to the internal conductor and the external conductor as a sine-wave excitation output, and on the way to these, noise is detected therefrom by a noise meter 41. Moreover, the high-frequency of 14 kHz is applied to the phase sensitive detector 8.

A voltage signal that is a detection signal of the detection coil 4 is inputted to the BPF 7 at which noise is eliminated therefrom, and inputted to the phase sensitive detector 8 at which the phase is detected, and then inputted to the smoothing filter 9. The smoothing filter 9 smoothes the phase-detected signal inputted thereto; thus, the detection circuit 40 is allowed to obtain a detection output corresponding to the intensity and direction of the magnetic field. Consequently, the detection circuit 40 finds the detection results (the intensity and direction of the magnetic field) based upon the detection output.

FIG. 14 is a schematic drawing that shows the construction of the testing device. In the testing device, a case 11, which has a cubic shape with each side having 12 cm, with each of the surrounding six faces being shielded by a plate (0.5 mm in thickness) made of permalloy so as to avoid influences from Earth's magnetic field, is formed. In the center of the inside thereof, a pair of support plates 12 and 13 are vertically placed in parallel with each other with a predetermined gap (approximately, 16 mm), and Helmholtz coils 14 and 15, each having a diameter of 32 mm, are secured to the respective opposing faces thereof in a coaxial manner, and a sample base 17, which is secured to the top of a freely rotatable support pillar 16, is placed between the Helmholtz coils 14 and 15. Here, reference numeral 18 is a rotary angle scale plate attached to the support pillar 16. As illustrated in FIG. 13, a magnetic sensor is placed on the sample base 17, and connected to the detection unit 50 so as to carry out a test.

The magnetic sensor manufactured in the fourth embodiment was placed on the sample base 17, and power is applied to the Helmholtz coils 14 and 15 so that a magnetic field was formed between these with a variable intensity. Further, the sample base 17 was rotated so that the angle θ made by the orientation (the axis direction of the internal conductor 1 and the external conductor 2) of the magnetic sensor and the direction of the magnetic field was changed; thus, the detection signal of the magnetic sensor was sampled each time the change was made.

Figure 15A:
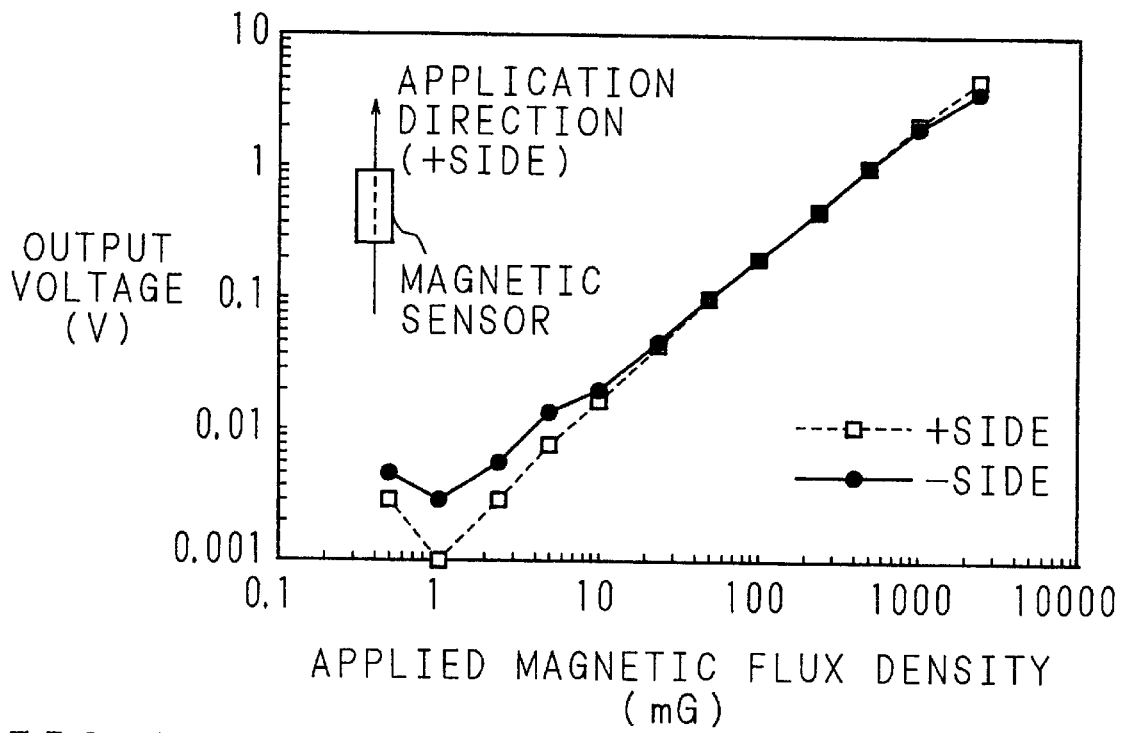
FIGS. 15A and 15B are graphs that show input/output characteristics that are test results of a magnetic sensor.
Figure 15B:
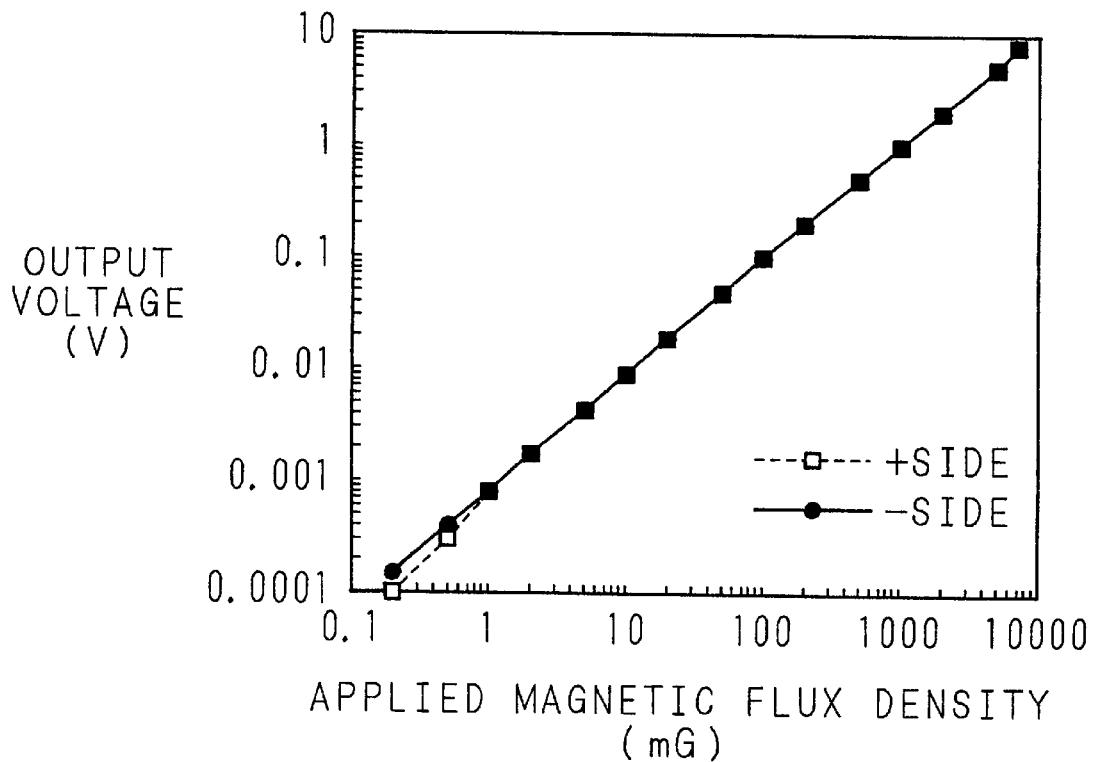

FIG. 15A and FIG. 15B show input/output characteristics that are the test results of the respective magnetic sensors manufactured in the fourth and fifth embodiments, and the sampling results of the applied magnetic flux density (mG) were plotted on the axis of abscissa, and those of the output voltage (V) serving as the detection signal were plotted on the axis of ordinate. In these graphs, marks □ and ● show cases in which the application direction of the magnetic field with respect to the magnetic sensor is reversed between positive (upward in the graph of FIG. 15A) and negative (downward in the same). As clearly indicated by these graphs showing the characteristics, in the case when the input/output ratio is set to 2V/G, the output voltage (V) changes in a substantially linear fashion in a range of 1 mG to 1 G with respect to the change in the applied magnetic flux density, thereby indicating that a superior linear property is exerted.

Figure 16A:
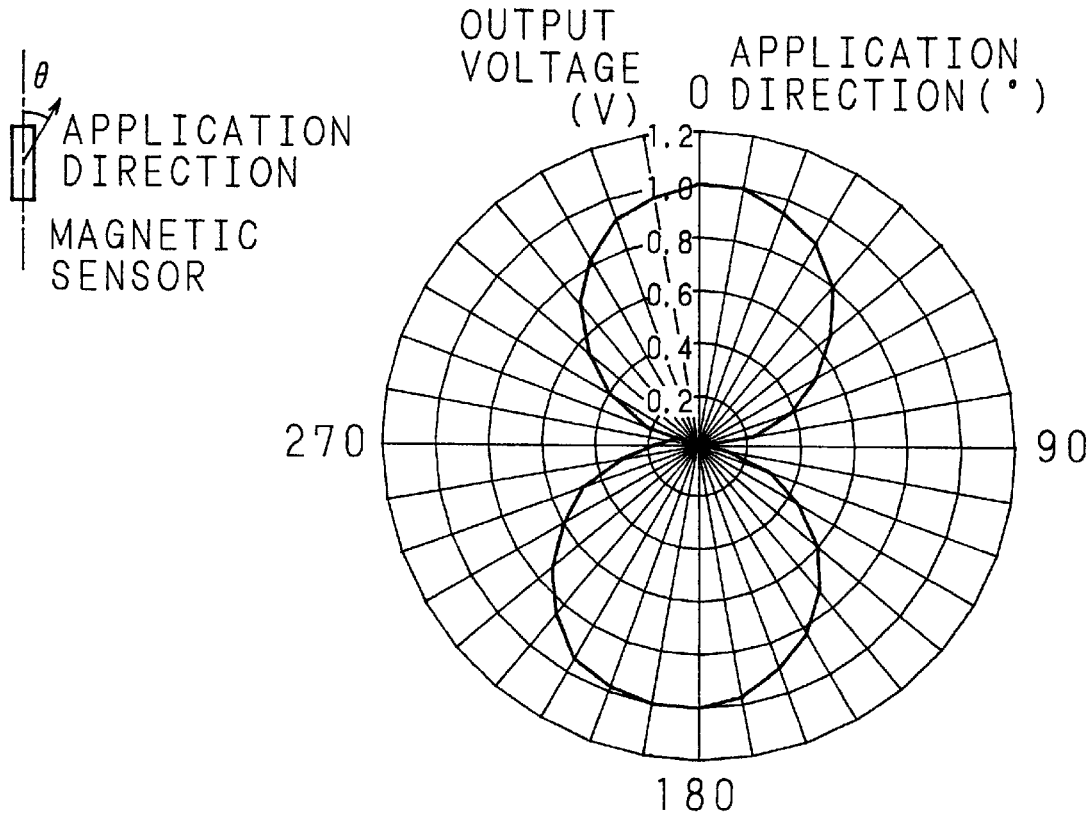
FIGS. 16A and 16B are drawings that show directional characteristics that are test results of a magnetic sensor.
Figure 16B:
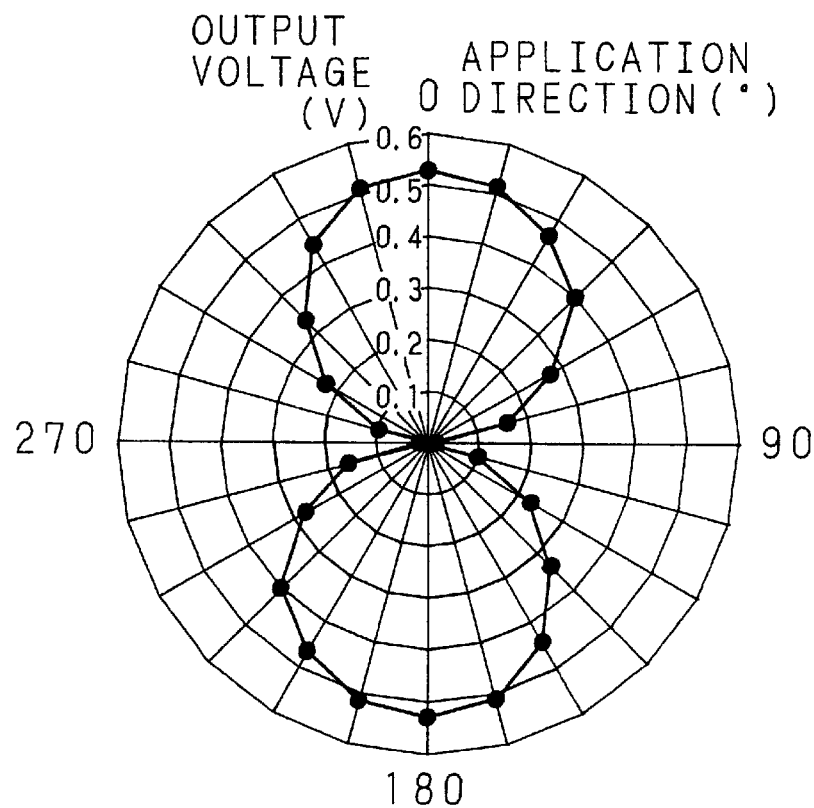

FIG. 16A and FIG. 16B show directional characteristics that are the test results of the respective magnetic sensors manufactured in the fourth and fifth embodiments, and the graphs indicate sampling results of the output voltage (V) obtained by changing the angle θ in the axis direction of the internal conductor 1 and the external conductor 2 of the magnetic sensor with respect to the application direction of the magnetic field (with an applied magnetic flux of 0.5 G in the direction of 0°). As clearly indicated by these directional characteristics, the output voltage is the greatest in the directions of 0° and 180° C. and the output voltage is substantially zero in the directions of 90° and 270°; this indicates that superior directional characteristic are exerted.

Figure 17A:
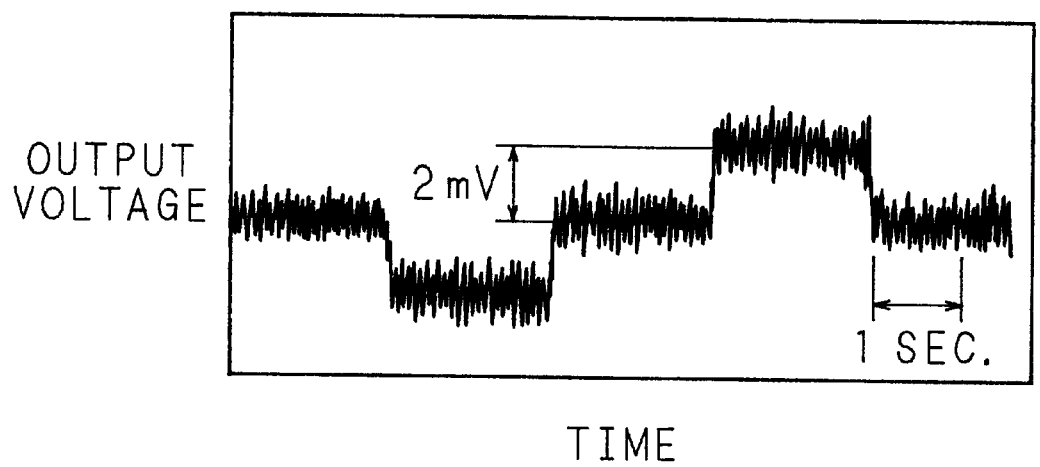
FIGS. 17A and 17B are graphs that show test results of resolution of a magnetic sensor.
Figure 17B:
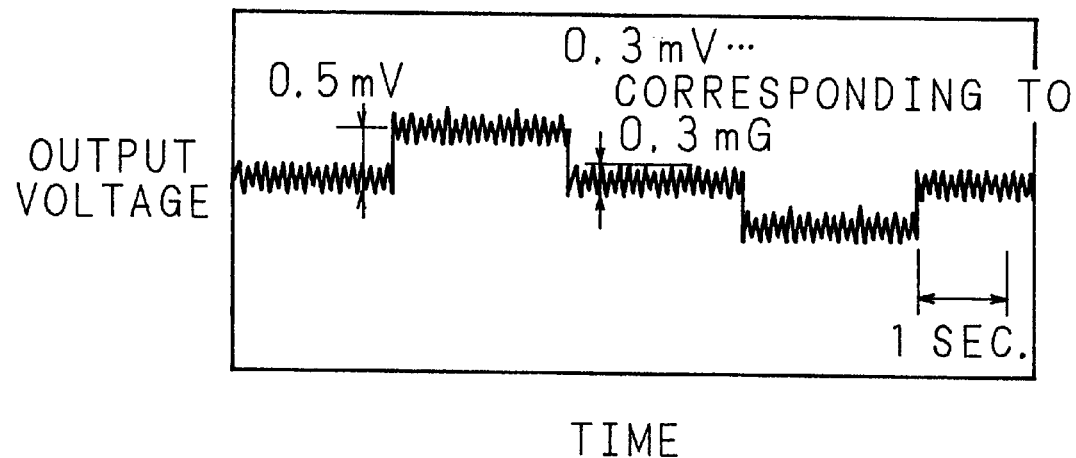

FIG. 17A and FIG. 17B show the results of test on resolution of the respective magnetic sensors manufactured in the fourth and fifth embodiments, and the time (seconds) was plotted on the axis of abscissa, and the output voltage (mV) was plotted on the axis of ordinate. With respect to the tests for the magnetic sensor manufactured in the fourth embodiment, the intensity of the magnetic field was changed in a stepped manner on the basis of 1 mG, and with respect to the tests for the magnetic sensor manufactured in the fifth embodiment, the intensity of the magnetic field was changed in a stepped manner on the basis of 0.5 mG; thus, the results of the output voltage (mV) were found respectively. As clearly indicated by these graphs, step response waveforms of 1 mG and 0.5 mG can be clearly discriminated.

Figure 18:
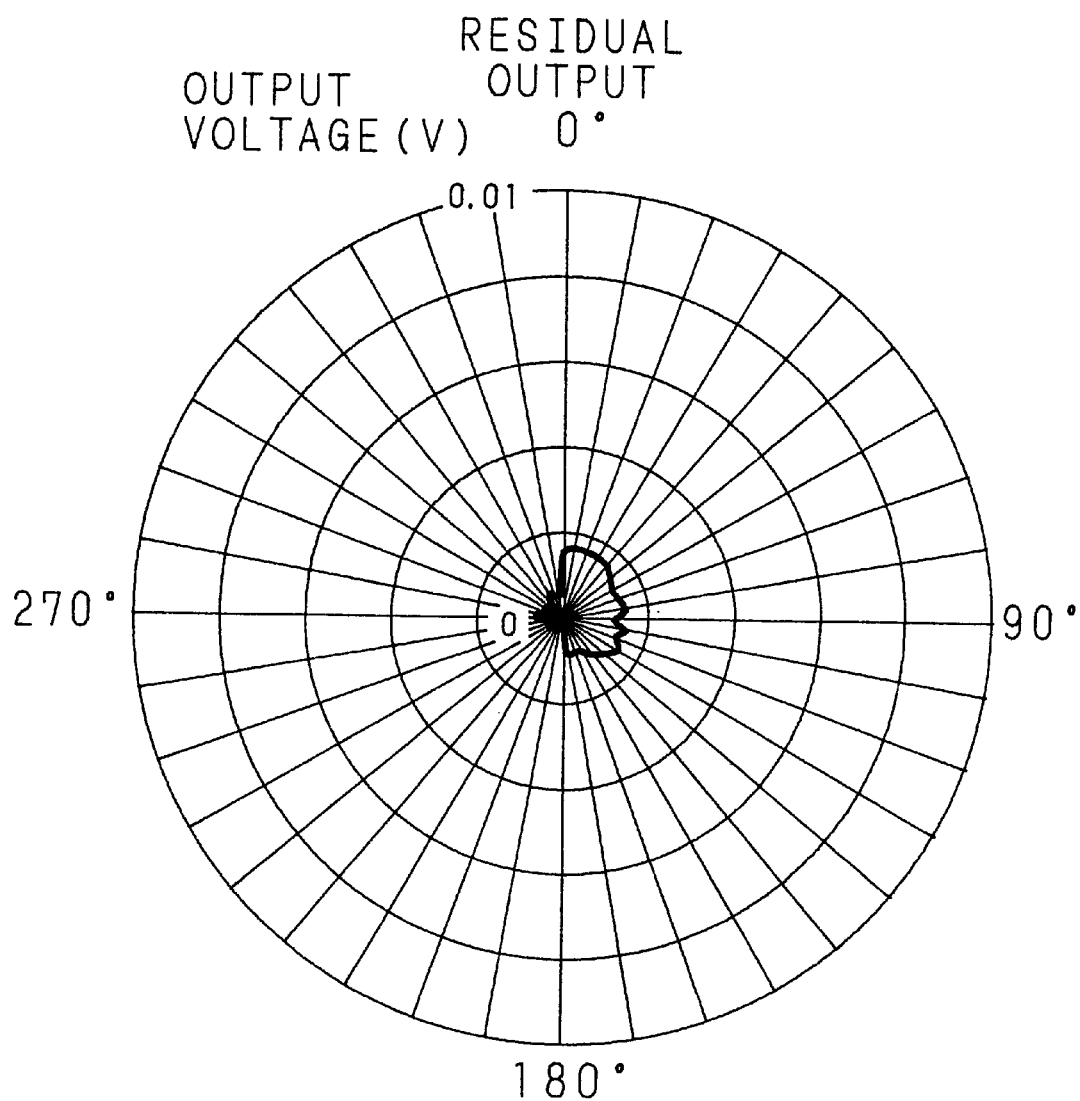
FIG. 18 is a drawing that indicates characteristics of test results on a residual output of the magnetic sensor manufactured in the fourth embodiment.

FIG. 18 shows characteristics that are the test results of the residual output of the magnetic sensor manufactured in the fourth embodiment, and the angle was plotted in the circumferential direction and the output voltage was plotted in the radial direction. In this test, in a state where no power was applied to the Helmholtz coils 14 and 15 in the testing device shown in FIG. 14, the sample base 17 was rotated so as to detect the residual magnetic flux density of the core 3 inside the case 11. The results show that the output voltage is not more than 2 mV, that is, the residual magnetic flux density of the core 3 is not more than 1 mG. With respect to the magnetic sensor manufactured in the fifth embodiment also, substantially the same test results were obtained. From these results, it is confirmed that a predetermined magnetic field was accurately applied to the magnetic sensor by completely eliminating disturbance factors such as Earth's magnetic field.

Figure 19:
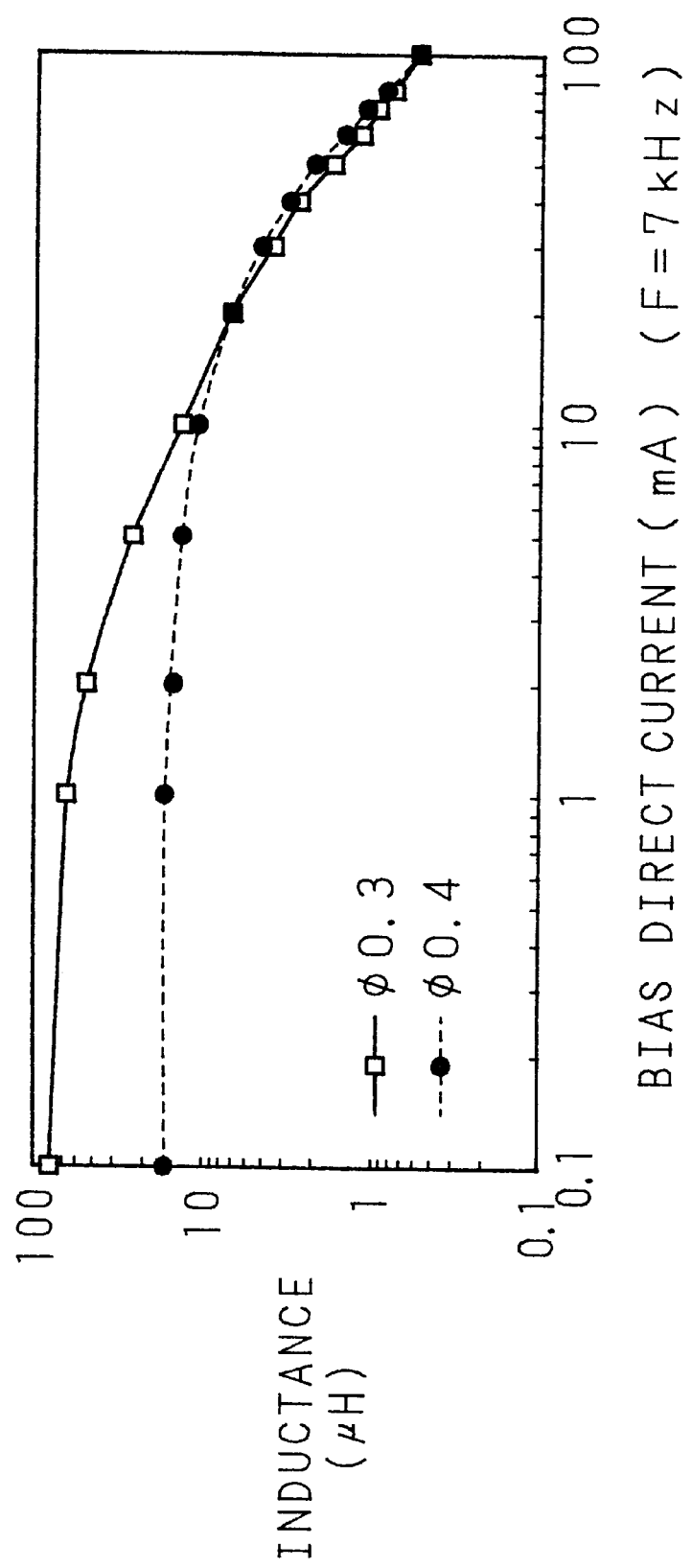
FIG. 19 is a graph that shows direct current bias characteristics of inductance in an exciting wire in the magnetic sensor manufactured in the fifth embodiment.

FIG. 19 shows test results obtained by measuring the direct current bias characteristics of the inductance of the magnetic sensor manufactured in the fifth embodiment by using an LC meter. FIG. 19 is a graph that shows the direct current bias characteristics of the inductance of the exciting lead wire, and the bias direct current (mA) was plotted on the axis of abscissa, and the inductance ($\mu$H) was plotted on the axis of ordinate. In FIG. 19, mark □ indicates the case of diameter 0.3 mm, and mark ● indicates the case of diameter 0.4 mm. As clearly indicated by this graph, with respect to the tube, the smaller the diameter, the lower the inductance even in the case of a small bias current. In other words, even a small exciting current may be used to magnetically saturate the core, thereby making it possible to reduce the exciting current.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A magnetic sensor, comprising:
   a cylindrical core made of a soft magnetic material;
   an internal conductor that is placed inside the core;
   an external conductor that is placed around the core and electrically connected to the internal conductor; and
   a detection coil wound up on the external conductor,
   wherein an AC current is allowed to flow through the internal conductor and external conductor so that a magnetic field to be measured residing around the detection coil is changed, and the intensity and direction of the magnetic field to be measured is detected on the basis of an output of the detection coil.

2. The magnetic sensor as defined in claim 1, wherein the external conductor is placed at least two positions that face each other with the core located in between.

3. The magnetic sensor as defined in claim 1, wherein the external conductor is constituted by a channel member having two ends that are closed by end plates, each plate having a hole through which the internal conductor is allowed to pass.

4. The magnetic sensor as defined in claim 1, wherein the external conductor is formed into a cylindrical shape.

5. The magnetic sensor as defined in claim 1, wherein the internal conductor is formed into a column shape and the external conductor and the core are respectively formed into a cylindrical shape.

6. The magnetic sensor as defined in claim 1, wherein one or a plurality of slits are formed on a peripheral wall of the external conductor in a manner so as to extend in an axis length direction.

7. The magnetic sensor as defined in claim 1, wherein the internal conductor and the external conductor are integrally connected to each other with respective ends thereof on the same side being electrically connected to each other.

8. The magnetic sensor as defined in claim 1, wherein the core is formed by a tube made of permalloy or sendust.

9. A magnetic sensor device, comprising:
   a magnetic sensor including; a cylindrical core made of a soft magnetic material, an internal conductor that is placed inside the core, an external conductor that is placed around the core and electrically connected to the internal conductor, and a detection coil wound up on the external conductor;
   a power source for applying an AC current to the internal conductor so as to change a magnetic field to be measured that resides around the detection coil; and
   a detection unit for detecting the intensity and direction of the magnetic field to be measured based upon a detection signal from the detection coil.

* * * * *